US011990729B2

(12) United States Patent
Huang et al.

(10) Patent No.: US 11,990,729 B2
(45) Date of Patent: May 21, 2024

(54) SHAPING PULSES USING A MULTI-SECTION OPTICAL LOAD

(71) Applicant: Lumentum Operations LLC, San Jose, CA (US)

(72) Inventors: Hao Huang, San Jose, CA (US); Mikhail Dolganov, Gilroy, CA (US); Lijun Zhu, Dublin, CA (US)

(73) Assignee: Lumentum Operations LLC, San Jose, CA (US)

( * ) Notice: Subject to any disclaimer, the term of this patent is extended or adjusted under 35 U.S.C. 154(b) by 305 days.

(21) Appl. No.: 16/916,976

(22) Filed: Jun. 30, 2020

(65) Prior Publication Data

US 2021/0296857 A1    Sep. 23, 2021

Related U.S. Application Data

(60) Provisional application No. 62/993,234, filed on Mar. 23, 2020, provisional application No. 62/993,419, filed on Mar. 23, 2020.

(51) Int. Cl.
| | |
|---|---|
| *H01S 5/042* | (2006.01) |
| *H01S 5/026* | (2006.01) |
| *H01S 5/0625* | (2006.01) |
| *H01S 5/183* | (2006.01) |
| *H01S 5/42* | (2006.01) |

(52) U.S. Cl.
CPC ........ *H01S 5/06253* (2013.01); *H01S 5/0261* (2013.01); *H01S 5/0428* (2013.01); *H01S 5/183* (2013.01); *H01S 5/423* (2013.01)

(58) Field of Classification Search
None
See application file for complete search history.

(56) References Cited

U.S. PATENT DOCUMENTS 5,583,351 A * 12/1996 Brown .............. H01L 27/14645
257/443
7,396,706 B2 * 7/2008 Sun .................... B23K 26/0622
219/121.69
(Continued)

FOREIGN PATENT DOCUMENTS

CN        112835059 A  *  5/2021  ............. G01S 17/10

OTHER PUBLICATIONS

"High Power VCSELs for Gesture Recognition," 2012, Finisar Corporation, Sunnyvale, CA, 5 pages.
(Continued)

*Primary Examiner* — Tod T Van Roy
(74) *Attorney, Agent, or Firm* — Harrity & Harrity, LLP

(57) ABSTRACT

An optical device may drive a compensation section of a multi-section optical load to emit a compensation optical pulse by providing, for a first time interval, a compensation electrical pulse to the compensation section. The optical device may drive a main section of the multi-section optical load to emit a main optical pulse by generating, for a second time interval, a main electrical pulse, wherein at least a portion of the first time interval overlaps with the second time interval. The optical device may emit a combined optical pulse, wherein the combined optical pulse includes the compensation optical pulse and the main optical pulse, and wherein the combined optical pulse has a shorter rise time than the main optical pulse.

25 Claims, 13 Drawing Sheets

(56) References Cited

U.S. PATENT DOCUMENTS

| | | | |
|---|---|---|---|
| 7,947,918 B2 | 5/2011 | Buhler et al. | |
| 8,599,891 B2* | 12/2013 | Maron | H01S 5/0428 372/38.07 |
| 9,493,765 B2 | 11/2016 | Krishnaswamy et al. | |
| 10,158,211 B2* | 12/2018 | Barnes | H01S 3/10 |
| 2002/0048303 A1* | 4/2002 | Strowitzki | H01S 3/0975 372/57 |
| 2003/0016711 A1* | 1/2003 | Crawford | H01S 5/042 372/38.02 |
| 2005/0067388 A1* | 3/2005 | Sun | B23K 26/0613 219/121.61 |
| 2006/0126677 A1* | 6/2006 | Sun | B23K 26/067 372/30 |
| 2007/0273862 A1 | 11/2007 | Barr | |
| 2010/0087699 A1 | 4/2010 | Peterchev | |
| 2010/0283322 A1* | 11/2010 | Wibben | H02M 3/158 307/31 |
| 2014/0204396 A1 | 7/2014 | Giger et al. | |
| 2014/0211192 A1* | 7/2014 | Grootjans | H02M 7/42 356/5.01 |
| 2017/0085057 A1* | 3/2017 | Barnes | H01S 5/0428 |
| 2018/0069367 A1* | 3/2018 | Villeneuve | G01S 7/4811 |
| 2020/0119527 A1 | 4/2020 | Hegblom | |
| 2020/0150240 A1* | 5/2020 | Huwer | G01S 7/4863 |
| 2020/0244044 A1* | 7/2020 | Ramer | H01S 5/0092 |
| 2020/0301669 A1* | 9/2020 | Paraiso | H01S 5/4006 |
| 2020/0333438 A1* | 10/2020 | Petrov | H04B 10/50 |
| 2021/0296855 A1* | 9/2021 | Huang | H01S 3/11 |
| 2021/0296857 A1* | 9/2021 | Huang | G01S 7/484 |
| 2022/0011410 A1* | 1/2022 | Huang | G01S 7/4865 |

OTHER PUBLICATIONS

Petrov et al., Co-pending U.S. Appl. No. 16/827,327, entitled "Methods for Driving Optical Loads and Driver Circuits for Optical Loads," filed Mar. 23, 2020 (38 pages).

* cited by examiner

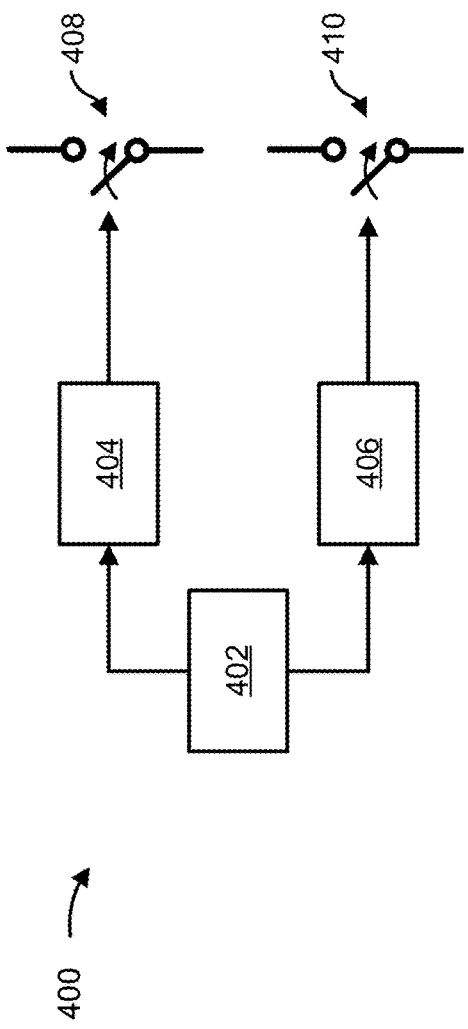
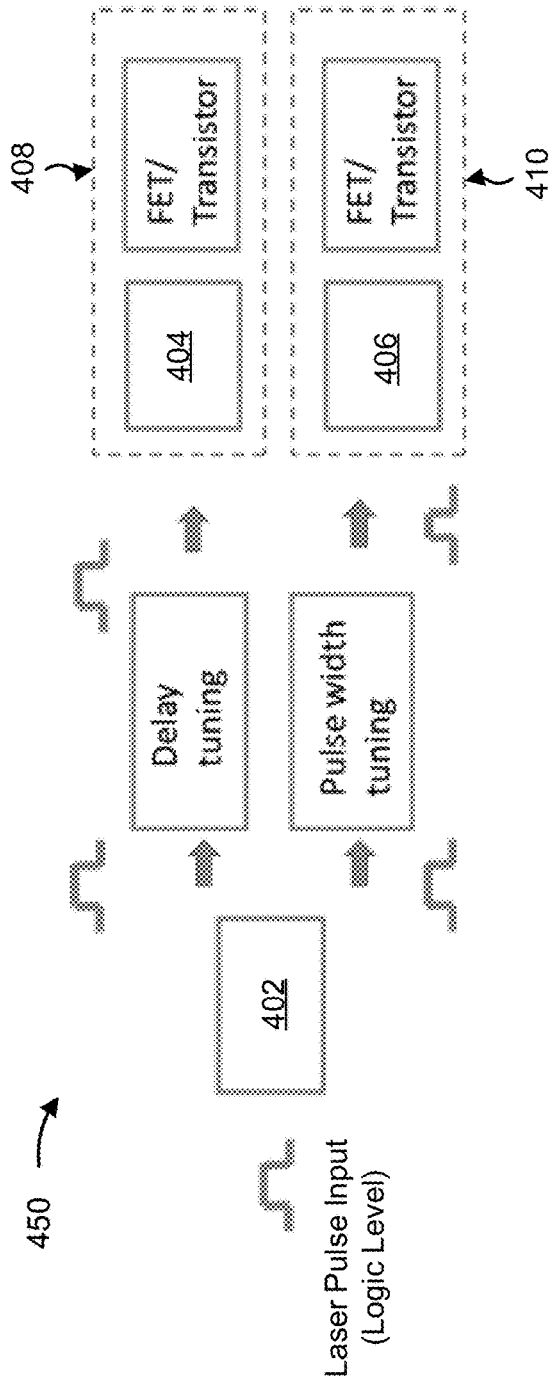
FIG. 4A
FIG. 4B

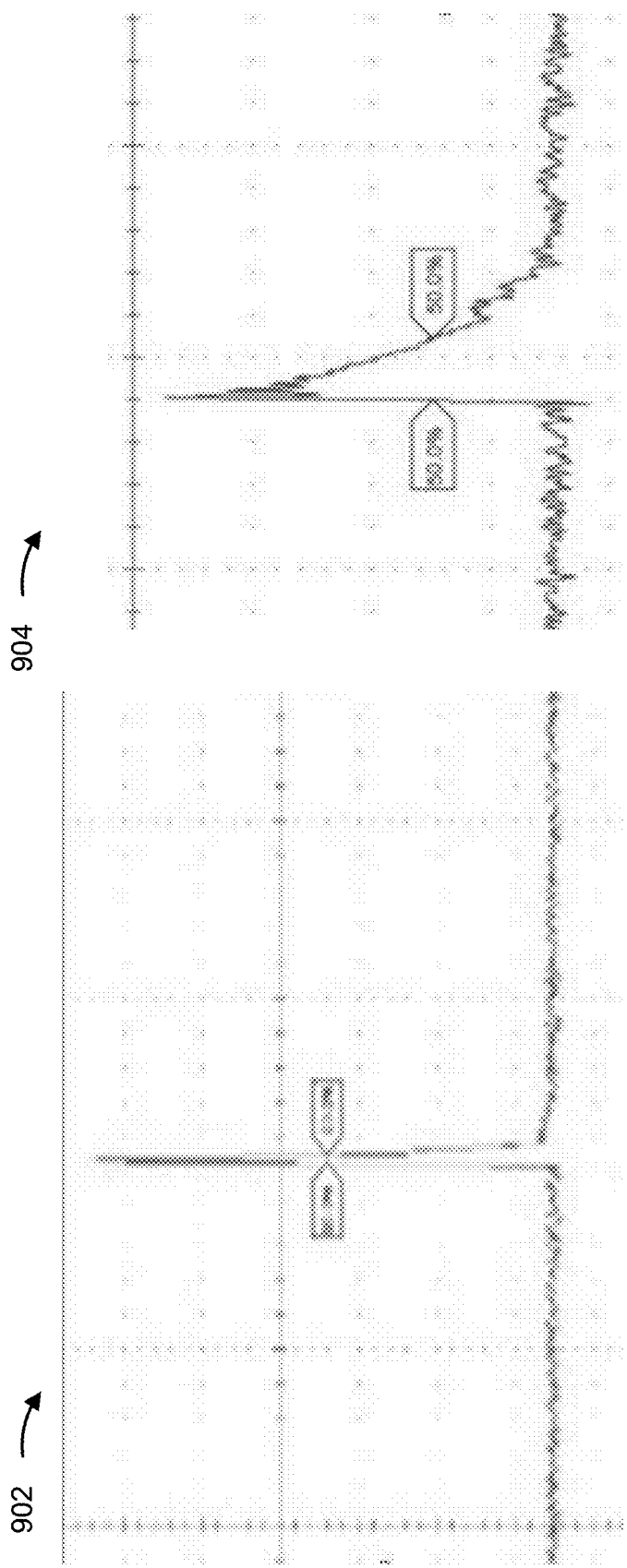

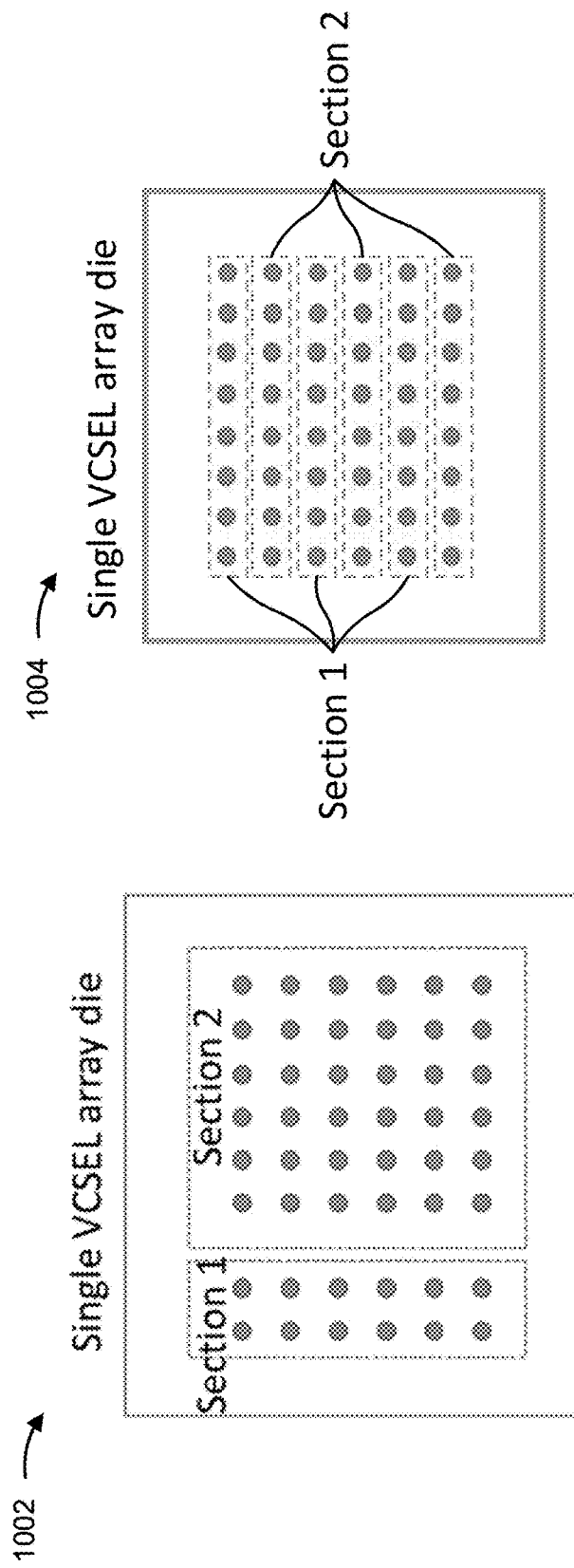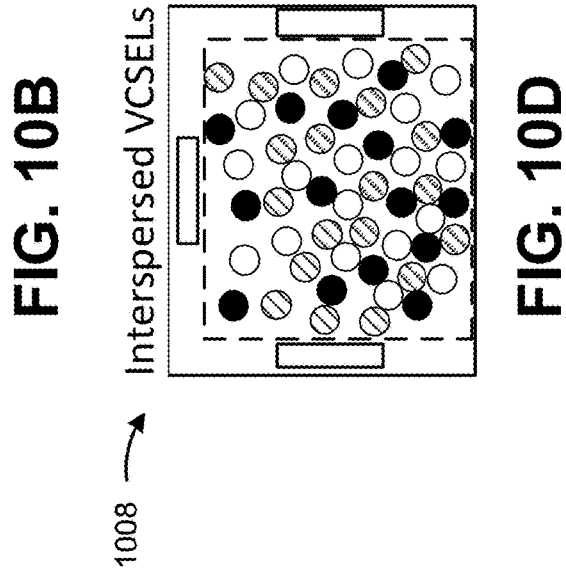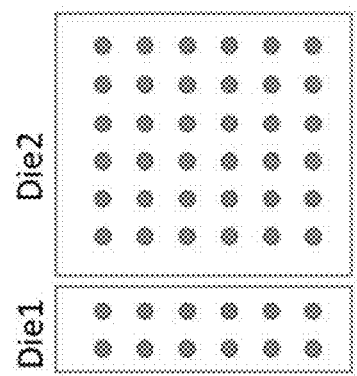

SHAPING PULSES USING A MULTI-SECTION OPTICAL LOAD

RELATED APPLICATION

This application claims priority to U.S. Provisional Patent Application No. 62/993,419, entitled "METHOD FOR SHAPING PULSES USING MULTI-SECTION VERTICAL-CAVITY SURFACE-EMITTING LASER ARRAY," filed on Mar. 23, 2020, and to U.S. Provisional Patent Application No. 62/993,234, entitled "RECONFIGURABLE LASER PULSE GENERATING CIRCUIT," filed on Mar. 23, 2020, the contents of which are incorporated by reference herein in their entirety.

TECHNICAL FIELD

The present disclosure relates generally to electrical drive circuits for optical loads and to methods and electrical drive circuits for driving multi-section optical loads to emit rectangular-shaped optical pulses.

BACKGROUND

Time-of-flight-based (TOF-based) measurement systems, such as three-dimensional (3D) sensing systems, light detection and ranging (LIDAR) systems, and/or the like, emit optical pulses into a field of view, detect reflected optical pulses, and determine distances to objects in the field of view by measuring delays and/or differences between the emitted optical pulses and the reflected optical pulses.

SUMMARY

According to some implementations, a method may include driving, by an electrical drive circuit, a compensation section of the multi-section optical load to emit a compensation optical pulse by providing, for a first time interval, a compensation electrical pulse to the compensation section; driving, by the electrical drive circuit, a main section of the multi-section optical load to emit a main optical pulse by generating, for a second time interval, a main electrical pulse, wherein at least a portion of the first time interval overlaps with the second time interval, wherein the compensation section and the main section are electrically separate sections of the multi-section optical load, and providing the main electrical pulse to the main section; and emitting, by an optical device including the electrical drive circuit and the multi-section optical load, a combined optical pulse, wherein the combined optical pulse includes the compensation optical pulse and the main optical pulse, and wherein the combined optical pulse has a shorter rise time than the main optical pulse.

According to some implementations, an electrical drive circuit may include a charging circuit path for charging, during a charging time, one or more inductive elements, a discharging circuit path for generating, during a first time interval after the charging time, a compensation electrical pulse by discharging the one or more inductive elements, a main circuit path for generating, during a second time interval, a main electrical pulse, wherein at least a portion of the first time interval overlaps with the second time interval, and wherein the electrical drive circuit is to provide a compensation electrical pulse to a compensation section of the multi-section optical load, and provide a main electrical pulse to a main section of the multi-section optical load, and wherein the compensation electrical pulse and the main electrical pulse are provided to the multi-section optical load via independent circuit paths.

According to some implementations, an optical device may include one or more sources, a multi-section optical load to emit light, wherein the multi-section optical load includes a compensation section and a main section, and wherein the compensation section is electrically separated from the main section within the multi-section optical load; a compensation circuit for generating a compensation electrical pulse and providing the compensation electrical pulse to the compensation section, a main circuit for generating a main electrical pulse and providing the main electrical pulse to the main section, and a controller to control the compensation circuit and the main circuit by causing the compensation circuit to generate the compensation electrical pulse for a first time interval, and causing the main circuit to generate the main electrical pulse for a second time interval, wherein at least a portion of the first time interval overlaps with the second time interval, and wherein the compensation section is to emit, in response to the compensation electrical pulse, a compensation optical pulse, wherein the main section is to emit, in response to the main electrical pulse, a main optical pulse, wherein a combined optical pulse includes the compensation optical pulse and the main optical pulse, and wherein the combined optical pulse has a shorter rise time than the main optical pulse.

BRIEF DESCRIPTION OF THE DRAWINGS

FIG. 4A is a diagram of an example implementation of a controller for an electrical drive circuit described herein.

FIG. 4B is a diagram of an example implementation of a process implemented by a controller for an electrical drive circuit described herein.

FIGS. 9A and 9B are diagrams of example graphs plotting voltages from an optical detector receiving optical signals associated with example implementations of electrical drive circuits and optical loads described herein.

FIGS. 10A, 10B, 10C, and 10D are diagrams of example implementations of a multi-section optical load described herein.

DETAILED DESCRIPTION

Figure 1A:
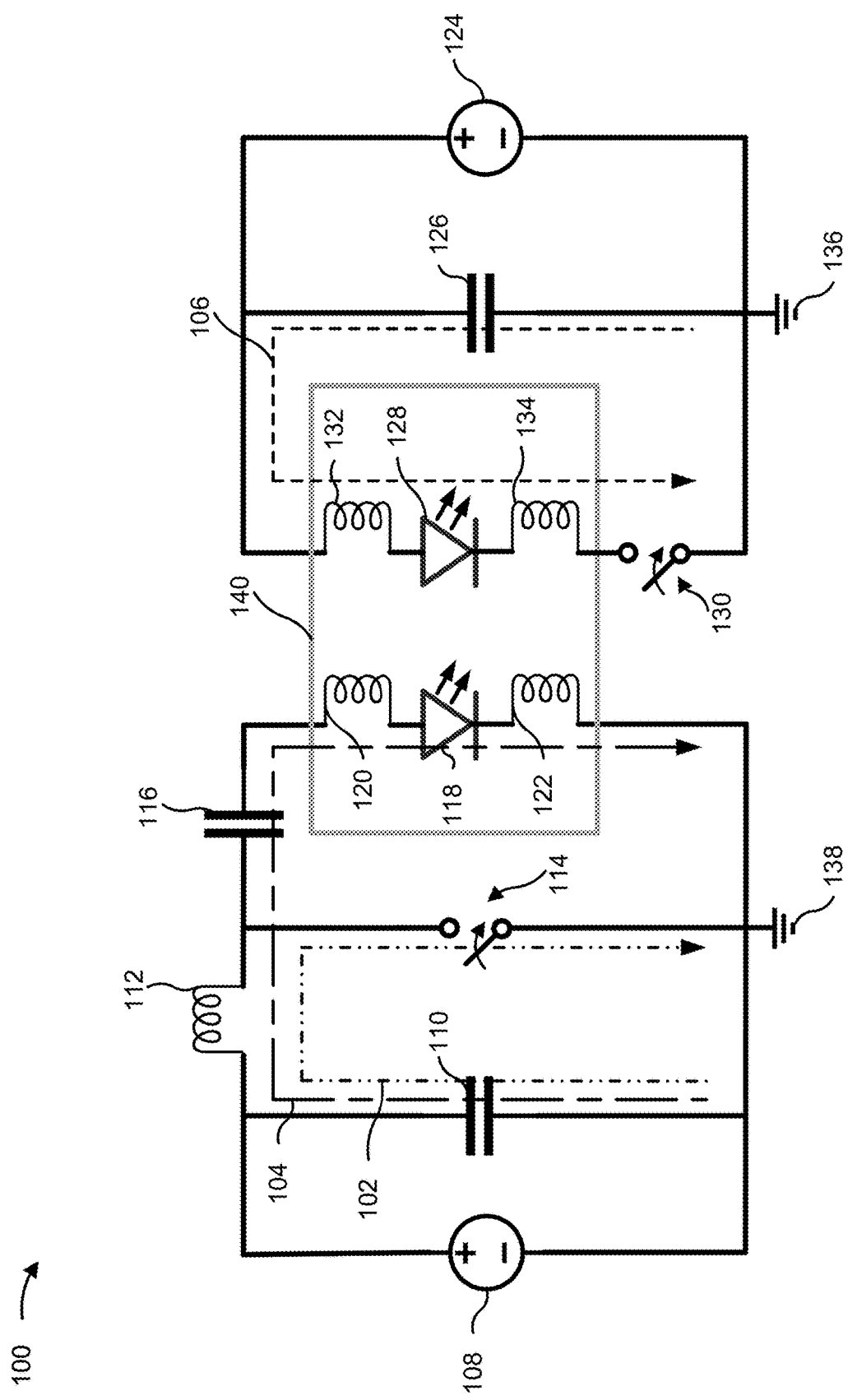
FIGS. 1A, 1B, 2, and 3 are circuit diagrams of example implementations of an electrical drive circuit and optical load described herein.

The following detailed description of example implementations refers to the accompanying drawings. The same reference numbers in different drawings may identify the same or similar elements.

TOF-based measurement systems may include an optical load (e.g., a laser diode, a semiconductor laser diode, a vertical-cavity surface-emitting laser (VCSEL), and/or the like) for emitting optical pulses into a field of view. As noted, TOF-based measurement systems may determine distances to objects by measuring delays and/or differences between an emitted optical pulse and a reflected optical pulse. TOF-based measurement systems may perform direct time-of-flight (d-TOF) measurements and/or indirect time-of-flight (i-TOF) measurements. For d-TOF applications, a narrow optical pulse may be emitted into a field of view. For i-TOF applications, a rectangular-shaped pulse train may be emitted into a field of view.

Emitting optical pulses having a well-defined origin in time and a rectangular shape may improve measurement precision and accuracy (e.g., as compared to optical pulses having a non-rectangular shape, a long rise time, and/or the like). To achieve such a rectangular shape, an emitted optical pulse should have a short rise time (e.g., a time during which power of the optical pulse is rising) and a short fall time (e.g., a time during which power of the optical pulse is falling). For example, the rise time of an optical pulse may be a time during which power of the optical pulse rises from 10% of peak power to 90% of peak power, and may be referred to as a 10%-90% rise time. Similarly, the fall time of an optical pulse may be a time during which power of the optical pulse falls from 90% of peak power to 10% of peak power, and may be referred to as a 90%-10% fall time.

A circuit for driving an optical load is a set of electronic components interconnected by current-carrying conductors (e.g., traces). Any of the electronic components and conductors may have parasitic elements (e.g., a parasitic inductance, a parasitic resistance, and/or a parasitic capacitance). These parasitic elements may be undesirable, and, therefore, sought to be minimized. However, completely eliminating these parasitic elements may not be possible (e.g., due to manufacturability limitations, component size limitations, and/or the like). When a supply voltage is provided to the circuit to drive the optical load, the parasitic inductance, the parasitic resistance, and/or the parasitic capacitance in the circuit cause a delay between when the supply voltage is provided and when a current reaches a peak. The delay increases the rise time of the electrical pulse, which increases the rise time of the optical pulse (e.g., particularly when the circuit drives the optical load with a high current).

Some implementations described herein provide a method and/or an electrical drive circuit for driving a multi-section optical load to emit a rectangular-shaped optical pulse and/or a pulse train of rectangular-shaped optical pulses. For example, the method and/or the electrical drive circuit may drive the multi-section optical load to emit an optical pulse having a short rise time (e.g., less than 100 picoseconds (ps)), a short fall time (e.g., less than 500 ps, less than 300 ps, and/or the like) and/or a constant amplitude. Some implementations described herein provide a method and/or an electrical drive circuit including one or more circuit paths for driving two sections of a multi-section optical load to each emit an optical pulse, and combining the emitted optical pulses in an optical domain to achieve a combined optical pulse having a rectangular shape.

In some implementations, the method and/or the electrical drive circuit may drive a compensation section of a multi-section optical load to emit a compensation optical pulse. For example, in some implementations, the compensation section may be driven to emit the compensation optical pulse by charging one or more inductive elements and discharging, after the charging and for a first time interval, the one or more inductive elements to provide a compensation electrical pulse to the compensation section. Additionally, or alternatively, the method and/or the electrical drive circuit may drive a main section of the multi-section optical load to emit a main optical pulse by generating, after the charging and for a second time interval, a main electrical pulse, where at least a portion of the first time interval overlaps with the second time interval, and providing the main electrical pulse to the main section. In some implementations, the multi-section optical load may emit a combined optical pulse including the compensation optical pulse and the main optical pulse, where the combined optical pulse has a shorter rise time than the main optical pulse. For example, the main optical pulse may have a longer rise time as compared to the compensation optical pulse, and a shorter rise time of the compensation optical pulse may compensate for the longer rise time of the main optical pulse.

In this way, the method and/or the electrical drive circuit may drive the multi-section optical load to emit a rectangular-shaped optical pulse and/or a pulse train of rectangular-shaped optical pulses. By driving the multi-section optical load to emit a rectangular-shaped optical pulse and/or a pulse train of rectangular-shaped optical pulses, the method and/or the electrical drive circuit may improve performance of a time-of-flight-based measurement system.

FIG. 1A is a circuit diagram of an example implementation 100 of an electrical drive circuit and a multi-section optical load 140 described herein. As shown in FIG. 1A, an optical device may include a charging circuit path 102, a discharging circuit path 104, and a main circuit path 106. In some implementations and as described further herein, the charging circuit path 102 and the discharging circuit path 104 may be used to generate a compensation electrical pulse to drive a compensation section 118, of the multi-section optical load 140, to emit a compensation optical pulse. Additionally, or alternatively, and as described further herein, the main circuit path 106 may be used to generate a main electrical pulse to drive a main section 128, of the multi-section optical load 140, to emit a main optical pulse.

As shown in FIG. 1A, the optical device may further include a compensation source 108, a compensation capacitive element 110, a compensation inductive element 112, a compensation switch 114, a blocking capacitive element 116, the compensation section 118 of the multi-section optical load 140, inductive elements 120 and 122, a main source 124, a main capacitive element 126, the main section 128 of the multi-section optical load 140, a main switch 130, inductive elements 132 and 134, a main ground 136, a compensation ground 138, and the multi-section optical load 140. In some implementations, the electrical drive circuit may include the charging circuit path 102, the discharging circuit path 104, the main circuit path 106, the compensation capacitive element 110, the compensation inductive element 112, the compensation switch 114, the blocking capacitive element 116, the inductive elements 120 and 122, the main capacitive element 126, the main switch 130, the inductive elements 132 and 134, the main ground 136, and the compensation ground 138. In some implementations, and as shown in FIG. 1A, the electrical drive circuit may include multiple electrical circuits (e.g., a compensation circuit and/or a compensation circuit path, including the charging circuit path 102 and the discharging circuit path 104, and a main circuit including the main circuit path 106).

In some implementations, the main electrical pulse and/or the compensation electrical pulse may also be referred to as a first electrical pulse, a second electrical pulse, and/or the like. Similarly, the main optical pulse and/or the compensation optical pulse may also be referred to as a first optical pulse, a second optical pulse, and/or the like. Additionally, or alternatively, the charging circuit path 102, the discharging circuit path 104, and/or the main circuit path 106 may also be referred to as a first circuit path, a second circuit path, a third circuit path, and/or the like. Additionally, or alternatively, the compensation capacitive element 110, the blocking capacitive element 116, and/or the main capacitive element 126 may also be referred to as a first capacitive element, a second capacitive element, a third capacitive element, and/or the like. In this regard, adjectives such as "main," "charging," "discharging," "compensation," and "blocking" are used herein for descriptive purposes and not to limit the scope of the elements, components, and/or the like which they modify, unless explicitly stated otherwise.

As shown in FIG. 1A, the charging circuit path 102 may be connected to the compensation source 108, and may include the compensation capacitive element 110, the compensation inductive element 112, and the compensation switch 114. The discharging circuit path 104 may be connected to the compensation source 108 and the compensation section 118, and may include the compensation capacitive element 110, the compensation inductive element 112, the blocking capacitive element 116, and the inductive elements 120 and 122. The main circuit path 106 may be connected to the main source 124 and the main section 128, and may include the main capacitive element 126, the main switch 130, and the inductive elements 132 and 134.

In some implementations, the compensation source 108 and/or the main source 124 may provide current to the electrical drive circuit. For example, the compensation source 108 and/or the main source 124 may be a direct current (DC) voltage source, a DC current source with a resistive load, and/or the like.

In some implementations, the compensation source 108 (e.g., a voltage source) may affect pulse height and/or width (e.g., amplitude and/or duration) of the compensation electrical pulse, which may affect pulse height and/or width (e.g., amplitude and/or duration) of the compensation optical pulse from the compensation section 118. For example, with increased voltage in the compensation source 108, the compensation electrical pulse and/or the compensation optical pulse may become larger and/or wider (e.g., increased amplitude and/or increased time duration). In some implementations, compensation current is supplied from the compensation capacitive element 110 (e.g., to the compensation section 118), and, as the voltage of the compensation source 108 increases, fall time of the compensation electrical pulse and/or the compensation optical pulse may increase.

In some implementations, the compensation capacitive element 110 may include one or more capacitors (e.g., of compensation circuitry). In some implementations, the compensation capacitive element 110 may be referred to as a decoupling capacitor that may provide a surge current (e.g., during a duration of the compensation electrical pulse). Additionally, or alternatively, the compensation capacitive element 110 may have a low equivalent serial inductance (ESL).

In some implementations, the compensation inductive element 112 may include one or more inductive elements, and/or may model a total inductance of the charging circuit path 102 and/or the discharging circuit path 104. For example, the compensation inductive element 112 may model inductances of current-carrying conductors in the electrical drive circuit, bond wires in the electrical drive circuit, and/or the like.

In some implementations, the compensation inductive element 112 may include a trace (e.g., a circuit trace on a printed circuit board (PCB), a wire trace, a track, and/or the like) having a length and/or a width based on required total inductance taking into account parasitic inductance of other circuit elements (e.g., current-carrying conductors in the electrical drive circuit, bond wires in the electrical drive circuit, and/or the like). In some implementations, the trace may have a length and/or a width to achieve a total inductance for the electrical drive circuit, the charging circuit path 102, and/or the discharging circuit path 104. For example, the trace may be designed (e.g., have a length, have a width, and/or the like) to add inductance to the electrical drive circuit, the charging circuit path 102, and/or the discharging circuit path 104, thereby increasing the total inductance for the electrical drive circuit, the charging circuit path 102, and/or the discharging circuit path 104.

Additionally, or alternatively, and as described further herein, an inductance of the compensation inductive element 112 and/or the total inductance of the electrical drive circuit, the charging circuit path 102, and/or the discharging circuit path 104 may be selected, controlled, adjusted, and/or the like such that a fall time of the compensation optical pulse corresponds to a rise time of the main optical pulse, which may facilitate driving the multi-section optical load 140 to emit a rectangular-shaped optical pulse (e.g., a square-shaped optical pulse). For example, the compensation inductive element 112 may include a trace having a length and/or a width to achieve, for the electrical drive circuit, the charging circuit path 102, and/or the discharging circuit path 104, a total inductance such that the compensation optical pulse, emitted in response to the compensation electrical pulse, has a width and/or an amplitude that compensates the main optical pulse.

In some implementations, the compensation switch 114 and/or the main switch 130 may be a high speed and low output capacitance switch. For example, the compensation switch 114 and/or the main switch 130 may be a transistor, such as a field effect transistor (FET), a metal-oxide semiconductor field-effect transistor (MOSFET), a Gallium Nitride field-effect transistor (GaNFET), an avalanche transistor, and/or the like. In some implementations, the compensation capacitive element 110 may model, at least in part, a capacitance of the compensation switch 114, and the main capacitive element 126 may model, at least in part, a capacitance of the main switch 130. In some implementations, the compensation switch 114 may have a low inductance (e.g., to facilitate achieving a short rise time of the compensation electrical pulse and/or the compensation optical pulse).

In some implementations, the blocking capacitive element 116 may be a blocking capacitor, and the compensation section 118 may be alternating-current-coupled (AC-coupled). For example, the blocking capacitive element 116 may be a blocking capacitor preventing the compensation section 118 from emitting light when the compensation switch 114 is in a closed state. In such an example, the compensation source 108 may provide an input (e.g., a voltage, a current, and/or the like), where the input is greater than a threshold at which the compensation section 118 emits light (e.g., a laser threshold voltage and/or the like). By providing an input greater than the threshold at which the compensation section 118 emits light, the compensation source 108 may charge the compensation inductive element 112 with a greater amount of energy in a shorter amount of time than if the input was limited by the threshold at which the compensation section 118 emits light. If the blocking capacitive element 116, acting as a blocking capacitor, were absent, the compensation source 108 may either undesirably cause the compensation section 118 to emit light when the compensation switch 114 was closed (e.g., if the input was greater than the threshold of the compensation section 118), or the compensation source 108 may be limited to providing an input lower than the threshold of the compensation section 118, undesirably decreasing the amount of energy and/or amount of time for charging the compensation inductive element 112.

In some implementations, the inductive elements 120 and 122 may model parasitic inductances of current-carrying conductors in the electrical drive circuit, the discharging circuit path 104, and/or the multi-section optical load 140. Additionally, or alternatively, the inductive elements 120 and 122 may model parasitic inductances of bond wires in the electrical drive circuit, the discharging circuit path 104, and/or the multi-section optical load 140.

In some implementations, the main capacitive element 126 may be a voltage storage element, and may provide a surge current (e.g., during a duration of the main electrical pulse). Additionally, or alternatively, the main capacitive element 126 may include one or more capacitors.

In some implementations, the inductive elements 132 and 134 may model parasitic inductances of current-carrying conductors in the electrical drive circuit, the main circuit path 106, and/or the multi-section optical load 140. Additionally, or alternatively, the inductive elements 132 and 134 may model parasitic inductances of bond wires in the electrical drive circuit, the main circuit path 106, and/or the multi-section optical load 140.

In some implementations, the multi-section optical load 140 may include an array of one or more light-emitting diodes, an array of one or more laser diodes, an array of one or more semiconductor laser diodes, an array of one or more vertical-cavity surface-emitting lasers (VCSELs), and/or the like. In some implementations, the multi-section optical load 140 may comprise multiple optical loads electrically connected in parallel and/or in series. For example, the multi-section optical load 140 may include a VCSEL array with 400 emitters electrically connected in parallel. As another example, the multi-section optical load 140 may include multiple VCSELs (e.g., arrays or singlets) connected in series (e.g., on a printed circuit board (PCB)), which may provide increased optical power as compared to a single VCSEL array. In some implementations, as shown in FIG. 1A, the multi-section optical load 140 includes multiple sections that are electrically independent and connected to different circuits. For example, a first section of the multi-section optical load 140 may include the compensation section 118 and inductive elements 120 and 122, which are connected to the compensation circuit and/or compensation circuit path that includes the charging circuit path 102 and the discharging circuit path 104. As further shown in FIG. 1A, a second section of the multi-section optical load 140 may include the main section 128 and inductive elements 132 and 134, which are connected to the main circuit that includes the main circuit path 106. Accordingly, as described herein, the first section and the second section may be electrically separate sections of the multi-section optical load 140. However, it will be appreciated that, in some implementations, different sections of the multi-section optical load 140 may be electrically connected via other circuits (e.g., the electrical drive circuit).

As noted above, the multi-section optical load 140 may include the compensation section 118 and the main section 128. In some implementations, the multi-section optical load 140 may be a VCSEL array die (e.g., a die including an array of VCSELs), and each of the compensation section 118 and the main section 128 may be a section of the VCSEL array die. For example, the compensation section 118 may include a first set of VCSELs on the VCSEL array die, and the main section 128 may include a second set of VCSELs on the VCSEL array die. In some implementations, the compensation section 118 and the main section 128 may be adjacent to each other on the VCSEL array die, such that the first set of VCSELs of the compensation section 118 is adjacent to the second set of VCSELs of the main section 128.

Additionally, or alternatively, the compensation section 118 and the main section 128 may be interleaved on the VCSEL array die, such that the first set of VCSELs of the compensation section 118 are interspersed within the second set of VCSELs of the main section 128 and/or such that the second set of VCSELs of the main section 128 are interspersed within the first set of VCSELs of the compensation section 118. For example, the first set of VCSELs of the compensation section 118 and the second set of VCSELs of the main section 128 may be alternating rows of VCSELs on the VCSEL array die. Additionally, or alternatively, the first set of VCSELs of the compensation section 118 and/or the second set of VCSELs of the main section 128 may be positioned in a pattern (e.g., a regular pattern, a pseudo-random pattern, and/or the like), a shape (e.g., a rectangle, a square, a circle, and/or the like), and/or the like.

In some implementations, the multi-section optical load 140 may be a package of VCSEL array dies (e.g., placed in a same substrate and/or the like), and each of the compensation section 118 and the main section 128 may be a VCSEL array die of the package. For example, the compensation section 118 may include a first VCSEL array die of the package, and the main section 128 may include a second VCSEL array die of the package.

In some implementations, the multi-section optical load 140 may generally include multiple sections, and the electrical drive circuit may be a multi-channel electrical drive circuit in which each section of the multi-section optical load 140 is controlled by a different channel of the multi-channel electrical drive circuit. For example, the multi-section optical load 140 may include six sections, the electrical drive circuit may be a six-channel electrical drive circuit, and each section of the multi-section optical load 140 may be controlled by a different channel of the six-channel electrical drive circuit. Additionally, or alternatively, each section may include a same quantity of VCSELs, different quantities of VCSELs, and/or the like. In this way, a quantity of VCSELs driven by the electrical drive circuit to emit an optical pulse at a given time may be controlled, for example, such that the multi-section optical load 140 emits a rectangular-shaped optical pulse.

As noted above, the main circuit path 106 may be used to generate a main electrical pulse to drive the main section 128, of the multi-section optical load 140, to emit the main optical pulse. The main switch 130 may have an open state (e.g., an off state), where, when the main switch 130 is in the open state, current may not flow through the main switch 130. In some implementations, when the main switch 130 is in the open state, current may not flow through the main section 128. The main switch 130 may also have a closed state (e.g., an on state), where, when the main switch 130 is in the closed state, current may flow through the main switch 130. In some implementations, when the main switch 130 is in the closed state, current may flow through the main circuit path 106 and generate the main electrical pulse to drive the main section 128 to emit the main optical pulse. The electrical drive circuit may provide the main electrical pulse to the main section 128. In some implementations, and as described further herein, the main section 128 may emit, based on the main electrical pulse, a main optical pulse with a slow rise time (e.g., a long rise time) similar to an optical pulse shown and described herein with respect to FIG. 6.

As shown in FIG. 1A, the main capacitive element 126 (e.g., a voltage storage capacitive element) may be connected in parallel to the main source 124. In some implementations, because the main capacitive element 126 is connected closer to the multi-section optical load 140 than the main source 124, when the main switch 130 transitions from the open state to the closed state, current may flow through the main capacitive element 126 of the main circuit path 106 more immediately than through the main source 124.

In some implementations, an input (e.g., a voltage, a current, and/or the like) provided by the main source 124 may be controlled to adjust characteristics of the main electrical pulse and/or the main optical pulse. For example, a higher voltage provided by the main source 124 may increase a maximum amplitude of the main electrical pulse and/or the main optical pulse as compared to another maximum amplitude of the main electrical pulse and/or the main optical pulse when a lower voltage is provided by the main source 124. As another example, a higher voltage provided by the main source 124 may reduce a rise time of the main electrical pulse and/or the main optical pulse as compared to another rise time of the main electrical pulse and/or the main optical pulse when a lower voltage is provided by the main source 124.

As noted above, the charging circuit path 102 and the discharging circuit path 104 may be used to generate a compensation electrical pulse to drive a compensation section 118, of the multi-section optical load 140, to emit a compensation optical pulse. The compensation switch 114 may have an open state (e.g., an off state), where, when the compensation switch 114 is in the open state, current may not flow through the compensation switch 114. Additionally, the compensation switch 114 may have a closed state (e.g., an on state), where, when the compensation switch 114 is in the closed state, current may flow through the compensation switch 114. In some implementations, when the compensation switch 114 is in the closed state, current charges the compensation inductive element 112 (e.g., including one or more parasitic elements in the electrical drive circuit) through the charging circuit path 102. For example, when the compensation switch 114 is in the closed state, current may flow through the compensation switch 114 and charge (e.g., during a charging time) the compensation inductive element 112 (e.g., including one or more parasitic elements in the driver circuit) through the charging circuit path 102.

In some implementations, when the compensation switch 114 transitions from the closed state to the open state, current may not flow through the compensation switch 114, and current may discharge from the compensation inductive element 112 (e.g., as well as one or more parasitic elements in the electrical drive circuit) through the discharging circuit path 104 and generate a compensation electrical pulse to drive the compensation section 118 to emit a compensation optical pulse. For example, when the compensation switch 114 transitions from the closed state to the open state, current may not flow through the compensation switch 114, and current may discharge, during a discharge time, from the compensation inductive element 112 (e.g., as well as one or more parasitic elements in the electrical drive circuit) through the discharging circuit path 104.

As shown in FIG. 1A, the compensation capacitive element 110 (e.g., a voltage storage capacitive element) may be connected in parallel to the compensation source 108, and the compensation capacitive element 110 may be closer (e.g., in a practical sense) to the compensation inductive element 112 and the compensation section 118 than the compensation source 108. In some implementations, the compensation capacitive element 110 may provide a faster current change than the compensation source 108. For example, the compensation source 108 may have a large inductance in a path between the compensation source 108 and the compensation inductive element 112, which may prevent the compensation source 108 from providing a fast current change. In some implementations, a majority (e.g., almost 100%) of the current discharged through discharging circuit path 104 may be provided by the compensation capacitive element 110 (e.g., which may be slowly charged by the compensation source 108 before the compensation switch 114 transitions from the closed state to the open state).

In some implementations, an input (e.g., a voltage, a current, and/or the like) provided by the compensation source 108 may be controlled to adjust characteristics of the compensation electrical pulse and/or the compensation optical pulse. For example, a higher voltage provided by the compensation source 108 may increase a maximum amplitude of the compensation electrical pulse and/or the compensation optical pulse as compared to another maximum amplitude of the compensation electrical pulse and/or the compensation optical pulse when a lower voltage is provided by the compensation source 108. As another example, a higher voltage provided by the compensation source 108 may reduce a charging time of the compensation inductive element 112 as compared to another charging time of the compensation inductive element 112 when a lower voltage is provided by the compensation source 108. In some implementations, and as noted above, a capacitance of the compensation capacitive element 110 may affect pulse height and/or width (e.g., amplitude and/or duration) of the compensation electrical pulse and/or the compensation optical pulse.

Additionally, or alternatively, an inductance of the compensation inductive element 112 may be controlled to adjust characteristics of the compensation electrical pulse and/or the compensation optical pulse. For example, a higher inductance of the compensation inductive element 112 may increase a fall time of the compensation electrical pulse and/or the compensation optical pulse as compared to another fall time of the compensation electrical pulse and/or the compensation optical pulse when the compensation inductive element 112 has a lower inductance. In some implementations, and as further described herein with respect to FIGS. 8A and 8B, the inductance of the compensation inductive element 112 may be selected, controlled, adjusted, and/or the like such that a fall time of the compensation optical pulse corresponds to a rise time of the main optical pulse, which may facilitate driving the multi-section optical load 140 to emit a rectangular-shaped optical pulse.

The electrical drive circuit may provide the compensation electrical pulse to the compensation section 118. In some implementations, and as described further herein, the compensation section 118 may emit, based on the compensation electrical pulse, a compensation optical pulse with a short rise time (e.g., a fast rise time) similar to an optical pulse shown and described herein with respect to FIG. 5.

In some implementations, and as described further herein with respect to FIGS. 4A, 4B, 7, 8A, 8B, 9A, and 9B, a timing of the main switch 130 and the compensation switch 114 may be controlled (e.g., by a controller) such that the electrical drive circuit generates the main electrical pulse and the compensation electrical pulse, provides the main electrical pulse to the main section 128 to drive the main section 128 to emit the main optical pulse, and provides the compensation electrical pulse to the compensation section 118 to drive the compensation section 118 to emit the compensation optical pulse. For example, the timing of the main switch 130 and the compensation switch 114 may be controlled such that the compensation electrical pulse is discharged during a discharge time that at least partially overlaps with a time interval during which the main electrical pulse is generated. Additionally, or alternatively, the timing of the main switch 130 and the compensation switch 114 may be controlled such that a fall time of the compensation electrical pulse and/or the compensation optical pulse corresponds to a rise time of the main electrical pulse and/or the main optical pulse. Furthermore, the timing of the main switch 130 and the compensation switch 114 may be controlled such that a combined optical pulse, including the compensation optical pulse and the main optical pulse, has a rise time proportional to a rise time of the compensation optical pulse. Additionally, or alternatively, the timing of the main switch 130 and the compensation switch 114 may be controlled such that the combined optical pulse has a shorter fall time than the compensation optical pulse.

As indicated above, FIG. 1A is provided merely as an example. Other examples may differ from what is described with regard to FIG. 1A.

Figure 1B:
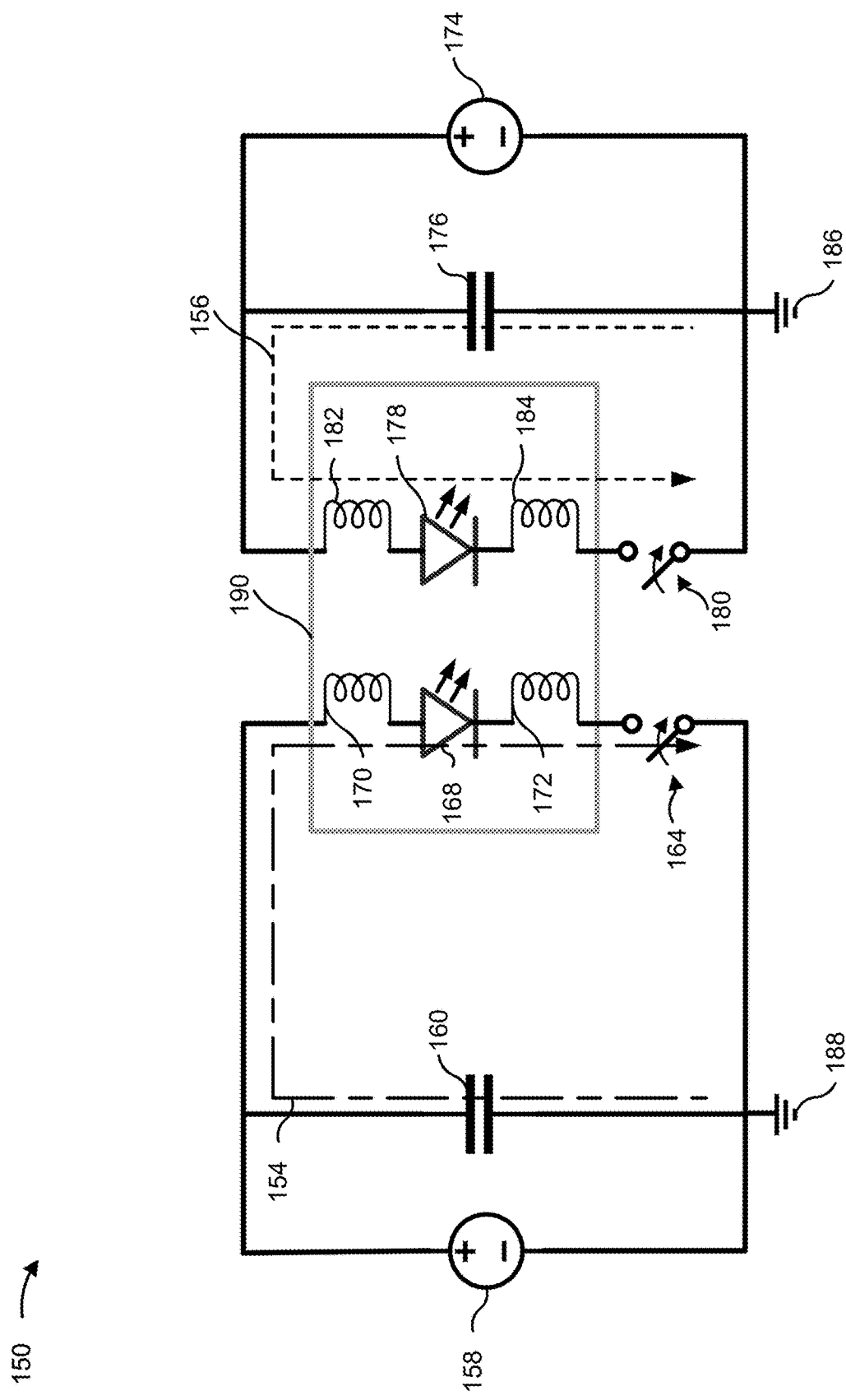

FIG. 1B is a circuit diagram of an example implementation 150 of an electrical drive circuit and a multi-section optical load 190 described herein. Example implementation 150 may be similar to example implementation 100 described herein with respect to FIG. 1A, but in example implementation 150, the compensation circuit may not include the charging circuit path 102, the compensation inductive element 112, the blocking capacitive element 116, and/or the like. Furthermore, in example implementation 150, the compensation circuit may include a compensation switch 164 in series with a compensation section 168 of the multi-section optical load 190. For example, and as shown in FIG. 1B, an optical device may include a compensation circuit path 154 provided in the compensation circuit and a main circuit path 156 provided in the main circuit.

In some implementations, the electrical drive circuit (e.g., via the compensation circuit path 154) may provide a current of a few hundreds of milliamps (mA) (e.g., a current in a range from about 200 mA to 500 mA, such as 300 mA, 350 mA, 400 mA, and/or the like) to the compensation section 168. Additionally, or alternatively, in such an implementation, the electrical drive circuit may use a different switch timing in which the compensation switch 164 in series with the compensation section 168 and the main switch 180 turn on (e.g., transition from an open state to a closed state) at approximately the same time.

In some implementations, the compensation circuit path 154 and the main circuit path 156 may be similar to the discharging circuit path 104 and the main circuit path 106, respectively, as described herein with respect to example implementation 100 and FIG. 1A. For example, when the compensation switch 164 is in the closed state, current may flow through the compensation circuit path 154, which may generate a compensation electrical pulse to drive the compensation section 168, of the multi-section optical load 190, to emit a compensation optical pulse. Similarly, when the main switch 180 is in the closed state, current may flow through the main circuit path 156 to generate a main electrical pulse to drive a main section 178, of the multi-section optical load 190, to emit a main optical pulse.

As shown in FIG. 1B, the optical device may further include a compensation source 158, a compensation capacitive element 160, the compensation section 168 of the multi-section optical load 190, inductive elements 170 and 172, a main capacitive element 176, the main section 178 of the multi-section optical load 190, a main switch 180, inductive elements 182 and 184, a main ground 186, a compensation ground 188, and the multi-section optical load 190. In some implementations, the electrical drive circuit may include the compensation circuit path 154, the main circuit path 156, the compensation capacitive element 160, the compensation switch 164, the inductive elements 170 and 172, the main capacitive element 176, the main switch 180, the inductive elements 182 and 184, the main ground 186, and the compensation ground 188.

In some implementations, the compensation source 158, the compensation capacitive element 160, the compensation switch 164, the compensation section 168, the inductive elements 170 and 172, the main capacitive element 176, the main section 178, the main switch 180, the inductive elements 182 and 184, and the multi-section optical load 190 may be similar to the compensation source 108, the compensation capacitive element 110, the compensation switch 114, the compensation section 118, the inductive elements 120 and 122, the main capacitive element 126, the main section 128, the main switch 130, the inductive elements 132 and 134, and the multi-section optical load 140, respectively, as described herein with respect to example implementation 100 and FIG. 1A.

As indicated above, FIG. 1B is provided merely as an example. Other examples may differ from what is described with regard to FIG. 1B.

Figure 2:
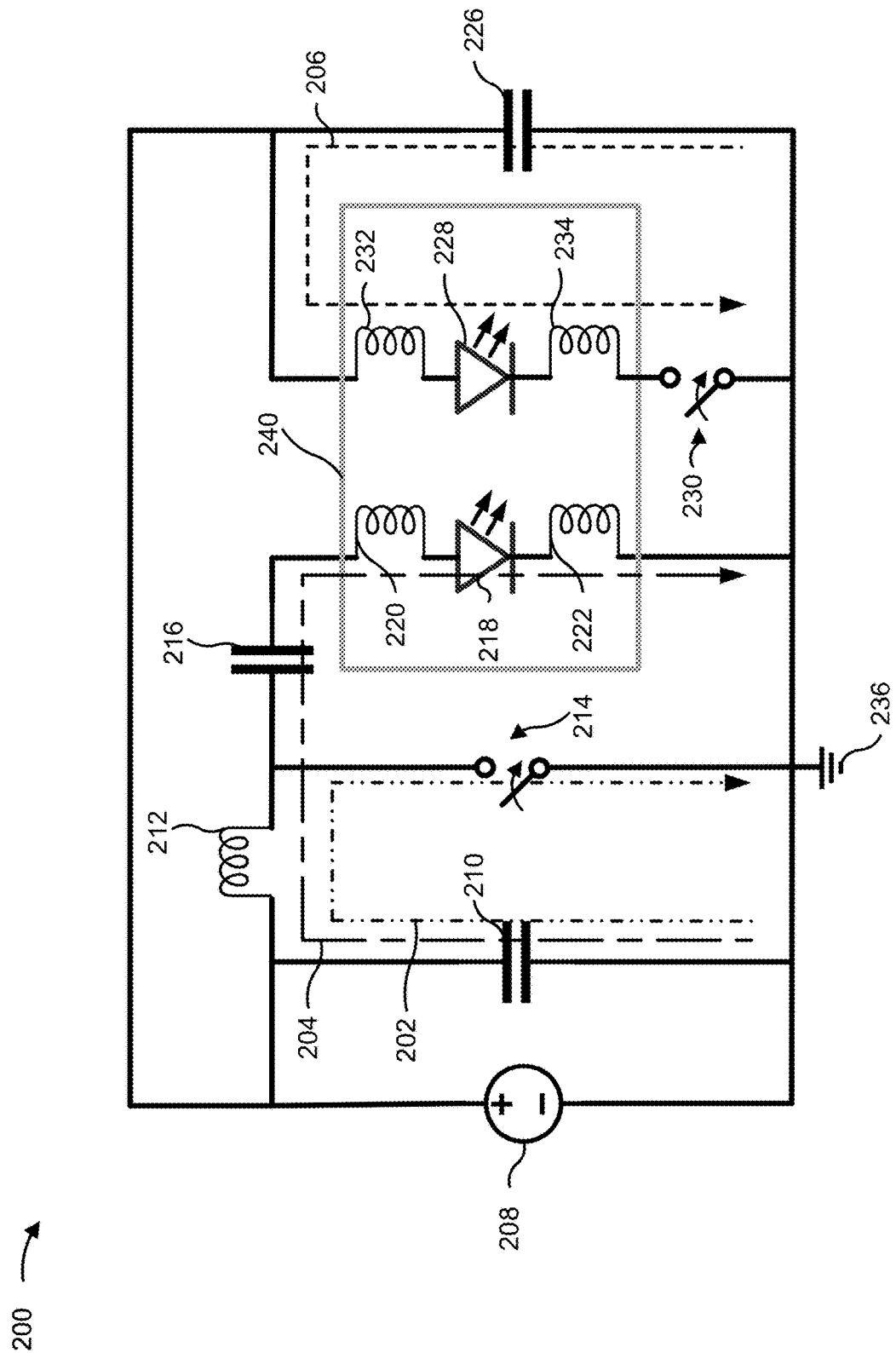

FIG. 2 is a circuit diagram of an example implementation 200 of an electrical drive circuit and a multi-section optical load 240 described herein. Example implementation 200 may be similar to example implementation 100 described herein with respect to FIG. 1A, but example implementation 200 may not include the main source 124 of example implementation 100. For example, and as shown in FIG. 2, an optical device may include a charging circuit path 202, a discharging circuit path 204, and a main circuit path 206 that are connected to a compensation source 208 (e.g., a single source).

In some implementations, the charging circuit path 202, the discharging circuit path 204, and the main circuit path 206 may be similar to the charging circuit path 102, the discharging circuit path 104, and the main circuit path 106, respectively, as described herein with respect to example implementation 100 and FIG. 1A. For example, the charging circuit path 202 and the discharging circuit path 204 may be used to generate a compensation electrical pulse to drive a compensation section 218, of the multi-section optical load 240, to emit a compensation optical pulse, and the main circuit path 206 may be used to generate a main electrical pulse to drive a main section 228, of the multi-section optical load 240, to emit a main optical pulse. In some implementations, a compensation circuit and/or a compensation circuit path may include the charging circuit path 202 and the discharging circuit path 204.

As shown in FIG. 2, the optical device may further include a compensation source 208, a compensation capacitive element 210, a compensation inductive element 212, a compensation switch 214, a blocking capacitive element 216, the compensation section 218 of the multi-section optical load 240, inductive elements 220 and 222, a main capacitive element 226, the main section 228 of the multi-section optical load 240, a main switch 230, inductive elements 232 and 234, a compensation ground 236, and the multi-section optical load 240. In some implementations, the electrical drive circuit may include the charging circuit path 202, the discharging circuit path 204, the main circuit path 206, the compensation capacitive element 210, the compensation inductive element 212, the compensation switch 214, the blocking capacitive element 216, the inductive elements 220 and 222, the main capacitive element 226, the main switch 230, the inductive elements 232 and 234, and the compensation ground 236.

In some implementations, the compensation source 208, the compensation capacitive element 210, the compensation inductive element 212, the compensation switch 214, the blocking capacitive element 216, the compensation section 218, the inductive elements 220 and 222, the main capacitive element 226, the main section 228, the main switch 230, the inductive elements 232 and 234, and the multi-section optical load 240 may be similar to the compensation source 108, the compensation capacitive element 110, the compensation inductive element 112, the compensation switch 114, the blocking capacitive element 116, the compensation section 118, the inductive elements 120 and 122, the main capacitive element 126, the main section 128, the main switch 130, the inductive elements 132 and 134, and the multi-section optical load 140, respectively, as described herein with respect to example implementation 100 and FIG. 1A.

In some implementations, an input (e.g., a voltage, a current, and/or the like) provided by the compensation source 208 may be controlled to adjust characteristics of the main electrical pulse and/or the main optical pulse in a manner similar to that described herein with respect to controlling an input provided by the main source 124 as described with respect to example implementation 100 and FIG. 1A. In other words, rather than controlling input provided by a main source to adjust characteristics of the main electrical pulse and/or the main optical pulse, in the example implementation 200 of FIG. 2, the input of the compensation source 208 may be controlled to adjust characteristics of the main electrical pulse and/or the main optical pulse. Additionally, or alternatively, the electrical drive circuit of example implementation 200 and/or a timing of the main switch 230 and the compensation switch 214 may be controlled (e.g., by a controller) in a manner similar to that described herein with respect to example implementation 100 and FIG. 1A.

As indicated above, FIG. 2 is provided merely as an example. Other examples may differ from what is described with regard to FIG. 2.

Figure 3:
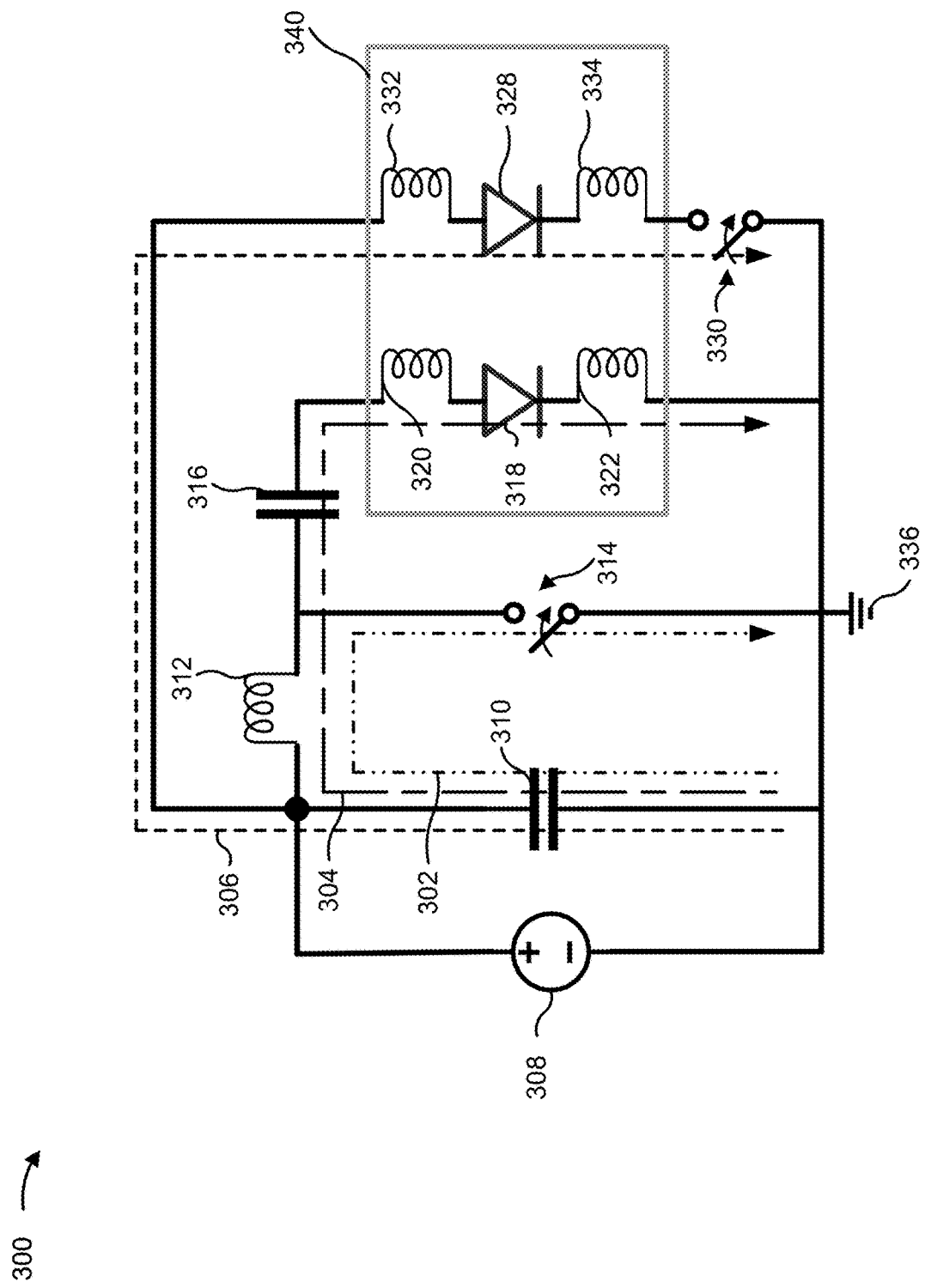

FIG. 3 is a circuit diagram of an example implementation 300 of an electrical drive circuit and a multi-section optical load 340 described herein. Example implementation 300 may be similar to example implementation 100 described herein with respect to FIG. 1A, but example implementation 300 may not include the main source 124 or the main capacitive element 126 of example implementation 100. For example, and as shown in FIG. 2, an optical device may include a charging circuit path 302, a discharging circuit path 304, and a main circuit path 306 that are connected to a compensation source 308 (e.g., a single source) and include (e.g., share) a compensation capacitive element 310.

In some implementations, the charging circuit path 302, the discharging circuit path 304, and the main circuit path 306 may be similar to the charging circuit path 102, the discharging circuit path 104, and the main circuit path 106, respectively, as described herein with respect to example implementation 100 and FIG. 1A. For example, the charging circuit path 302 and the discharging circuit path 304 may be used to generate a compensation electrical pulse to drive a compensation section 318, of the multi-section optical load 340, to emit a compensation optical pulse, and the main circuit path 306 may be used to generate a main electrical pulse to drive a main section 328, of the multi-section optical load 340, to emit a main optical pulse. In some implementations, a compensation circuit and/or a compensation circuit path may include the charging circuit path 302 and the discharging circuit path 304.

As shown in FIG. 3, the optical device may further include a compensation source 308, a compensation capacitive element 310, a compensation inductive element 312, a compensation switch 314, a blocking capacitive element 316, the compensation section 318 of the multi-section optical load 340, inductive elements 320 and 322, the main section 328 of the multi-section optical load 340, a main switch 330, inductive elements 332 and 334, a compensation ground 336, and the multi-section optical load 340. In some implementations, the electrical drive circuit may include the charging circuit path 302, the discharging circuit path 304, the main circuit path 306, the compensation capacitive element 310, the compensation inductive element 312, the compensation switch 314, the blocking capacitive element 316, the inductive elements 320 and 322, the main switch 330, the inductive elements 332 and 334, and the compensation ground 336.

In some implementations, the compensation source 308, the compensation capacitive element 310, the compensation inductive element 312, the compensation switch 314, the blocking capacitive element 316, the compensation section 318, the inductive elements 320 and 322, the main section 328, the main switch 330, the inductive elements 332 and 334, and the multi-section optical load 340 may be similar to the compensation source 108, the compensation capacitive element 110, the compensation inductive element 112, the compensation switch 114, the blocking capacitive element 116, the compensation section 118, the inductive elements 120 and 122, the main section 128, the main switch 130, the inductive elements 132 and 134, and the multi-section optical load 140, respectively, as described herein with respect to example implementation 100 and FIG. 1A.

In some implementations, an input (e.g., a voltage, a current, and/or the like) provided by the compensation source 308 may be controlled to adjust characteristics of the main electrical pulse and/or the main optical pulse in a manner similar to that described herein with respect to controlling an input provided by the main source 124 as described with respect to example implementation 100 and FIG. 1A. In other words, rather than controlling input provided by a main source to adjust characteristics of the main electrical pulse and/or the main optical pulse, in the example implementation 300 of FIG. 3 the input of the compensation source 308 may be controlled to adjust characteristics of the main electrical pulse and/or the main optical pulse.

In some implementations, the compensation capacitive element 310 may affect pulse height and/or width (e.g., amplitude and/or duration) of the main electrical pulse and/or the main optical pulse in a manner similar to that described herein with respect to the main capacitive element 126 affecting pulse height and/or width of the main electrical pulse and/or the main optical pulse. In other words, rather than a capacitance of a main capacitive element affecting pulse height and/or width of the main electrical pulse and/or the main optical pulse, in the example implementation 300 of FIG. 3, a capacitance of the compensation capacitive element 310 may affect pulse height and/or width of the main electrical pulse and/or the main optical pulse.

Additionally, or alternatively, the electrical drive circuit of example implementation 300 and/or a timing of the main switch 330 and the compensation switch 314 may be controlled (e.g., by a controller) in a manner similar to that described herein with respect to example implementation 100 and FIG. 1A.

As indicated above, FIG. 3 is provided merely as an example. Other examples may differ from what is described with regard to FIG. 3.

FIG. 4A is a diagram of an example implementation 400 of a controller 402 for an electrical drive circuit described herein. As shown in FIG. 4A, the example implementation 400 may include the controller 402, a main gate driver 404, a compensation gate driver 406, a main switch 408, and a compensation switch 410. In some implementations, an integrated circuit may include the controller 402, the main gate driver 404, the compensation gate driver 406, the main switch 408, the compensation switch 410, and/or the like.

Additionally, or alternatively, the main switch 408 and the compensation switch 410 may be similar to the main switch 130 and the compensation switch 114, respectively, as described herein with respect to example implementation 100 and FIG. 1A, the main switch 180 and the compensation switch 164, respectively, as described herein with respect to example implementation 150 and FIG. 1B, and/or the like. Furthermore, the main switch 408 and the compensation switch 410 may, respectively, correspond to main switches (e.g., the main switch 130 of FIG. 1A, the main switch 180 of FIG. 1B, the main switch 230 of FIG. 2, the main switch 330 of FIG. 3, and/or the like) and compensation switches (e.g., the compensation switch 114 of FIG. 1A, the compensation switch 164 of FIG. 1B, the compensation switch 214 of FIG. 2, the compensation switch 314 of FIG. 3, and/or the like) in the example implementations 100, 200, and 300. In other words, example implementation 400 and controller 402 may be used to control main switches and compensation switches for the electrical drive circuits described herein with respect to FIGS. 1A, 1B, 2, and/or 3. For example, as described above, FIGS. 1A and 1B relate to designs that use two independent voltage sources (e.g., compensation source 108 and main source 124, compensation source 158 and main source 174, and/or the like), each having a capacitor (e.g., compensation capacitive element 110 and main capacitive element 126, compensation capacitive element 160 and main capacitive element 176, and/or the like), which generally provides a flexible configuration. In some cases, however, where the two independent voltage sources require the same voltage, the circuit can be simplified to reduce a bill of materials (BOM) cost. For example, as shown in FIG. 2, the circuit may use only one DC source but two capacitors, each of which is placed close to the anode of an optical load. Additionally, or alternatively, as shown in FIG. 3, two optical loads can share a single voltage source and a single capacitor to further reduce the BOM cost with a minor performance cost relative to the designs shown in FIGS. 1A, 1B, and 2. Accordingly, as the various designs illustrated in FIGS. 1A, 1B, 2, 3 generally operate in a similar manner (e.g., by providing a compensation electrical pulse to a compensation section for a first time interval and generating a main electrical pulse for a second time interval that at least partially overlaps with the second time interval), example implementation 400 and controller 402 may be used to control main switches and compensation switches for any of the electrical drive circuits described herein with respect to FIGS. 1A, 1B, 2, and/or 3.

FIG. 4B is a diagram of an example implementation 450 of a process implemented by the controller 402 for an electrical drive circuit described herein. As shown in FIG. 4B, the controller 402 may receive a laser pulse input (logic level) (e.g., a logic input signal), which may signal that an optical load (e.g., the multi-section optical load 140 of FIG. 1A, the multi-section optical load 240 of FIG. 2, the multi-section optical load 340 of FIG. 3, and/or the like) driven by the electrical drive circuit should turn on. The controller 402 may, based on the laser pulse input, generate control signals (e.g., voltages) for the main gate driver 404 and/or the compensation gate driver 406 to turn the main switch 408 and/or the compensation switch 410 on or off (e.g., to open or close the main switch 408 and/or the compensation switch 410) according to switch timings described herein (e.g., with respect to FIG. 7 and/or the like).

As shown in FIG. 4B, the process of example implementation 450 may include the controller 402 performing delay tuning for the control signal provided to the main gate driver 404 of the main switch 408. As described herein with respect to FIG. 1A, the timing of the main switch 130 and the compensation switch 114 may be controlled such that the compensation electrical pulse is discharged during a discharge time that at least partially overlaps with a time interval during which the main electrical pulse is generated. When the controller 402 performs delay tuning, the controller 402 may adjust the control signal provided to the main gate driver 404 of the main switch 408 such that the compensation electrical pulse is discharged during a discharge time that at least partially overlaps with a time interval during which the main electrical pulse is generated. For example, and as further described with respect to FIG. 7, the controller 402 may perform delay tuning to adjust a time interval between when the compensation switch 410 transitions from a closed state to an open state (e.g., to generate the compensation electrical pulse) and when the main switch 408 transitions from an open state to a closed state (e.g., to generate the main electrical pulse).

As also shown in FIG. 4B, the process of example implementation 450 may include the controller 402 performing pulse width tuning for the control signal provided to the compensation gate driver 406 of the compensation switch 410. As described herein with respect to FIG. 1A, when the compensation switch 114 is in the closed state, current may flow through the compensation circuit (e.g., via the charging circuit path 102) and charge, during a charging time, the compensation inductive element 112, and when the compensation switch 114 transitions from the closed state to the open state, current may discharge from the compensation inductive element 112 (e.g., via the discharging circuit path 104) to generate the compensation electrical pulse to drive the compensation section 118 to emit the compensation optical pulse. Additionally, or alternatively, as described herein with respect to FIG. 1B, when the compensation switch 164 is in the closed state, current may flow through the compensation circuit (e.g., via the compensation circuit path 154) to generate the compensation electrical pulse to drive the compensation section 168 to emit the compensation optical pulse. In some implementations, a longer charging time may generate a wider pulse width for the compensation electrical pulse and/or the compensation optical pulse than a pulse width achieved with a shorter charging time. Thus, an amount of time when the compensation switch 410 is in a closed state may be adjusted to tune a pulse width of the compensation electrical pulse and/or the compensation optical pulse. In some implementations, when the controller 402 performs pulse width tuning, the controller 402 may adjust the control signal provided to the compensation gate driver 406 of the compensation switch 410 such that the compensation switch 410 is in the closed state for a duration of time that achieves a pulse width for the compensation optical pulse that corresponds to a rise time of the main optical pulse.

Furthermore, tuning the pulse width of the compensation electrical pulse may adjust a fall time of the compensation electrical pulse and/or the compensation optical pulse. Accordingly, the time that the compensation switch 410 is in the closed state may be adjusted to tune the fall time of the compensation electrical pulse and/or the compensation optical pulse. Thus, in some implementations, the controller 402 may perform pulse width tuning such that a fall time of the compensation optical pulse corresponds to a rise time of the main optical pulse. For example, when the controller 402 performs pulse width tuning, the controller 402 may adjust the control signal provided to the compensation gate driver 406 of the compensation switch 410 such that the compensation switch 410 is in the closed state for a duration of time that achieves a fall time of the compensation optical pulse that corresponds to a rise time of the main optical pulse.

As indicated above, FIGS. 4A and 4B are provided merely as examples. Other examples may differ from what is described with regard to FIGS. 4A and 4B.

Figure 5:
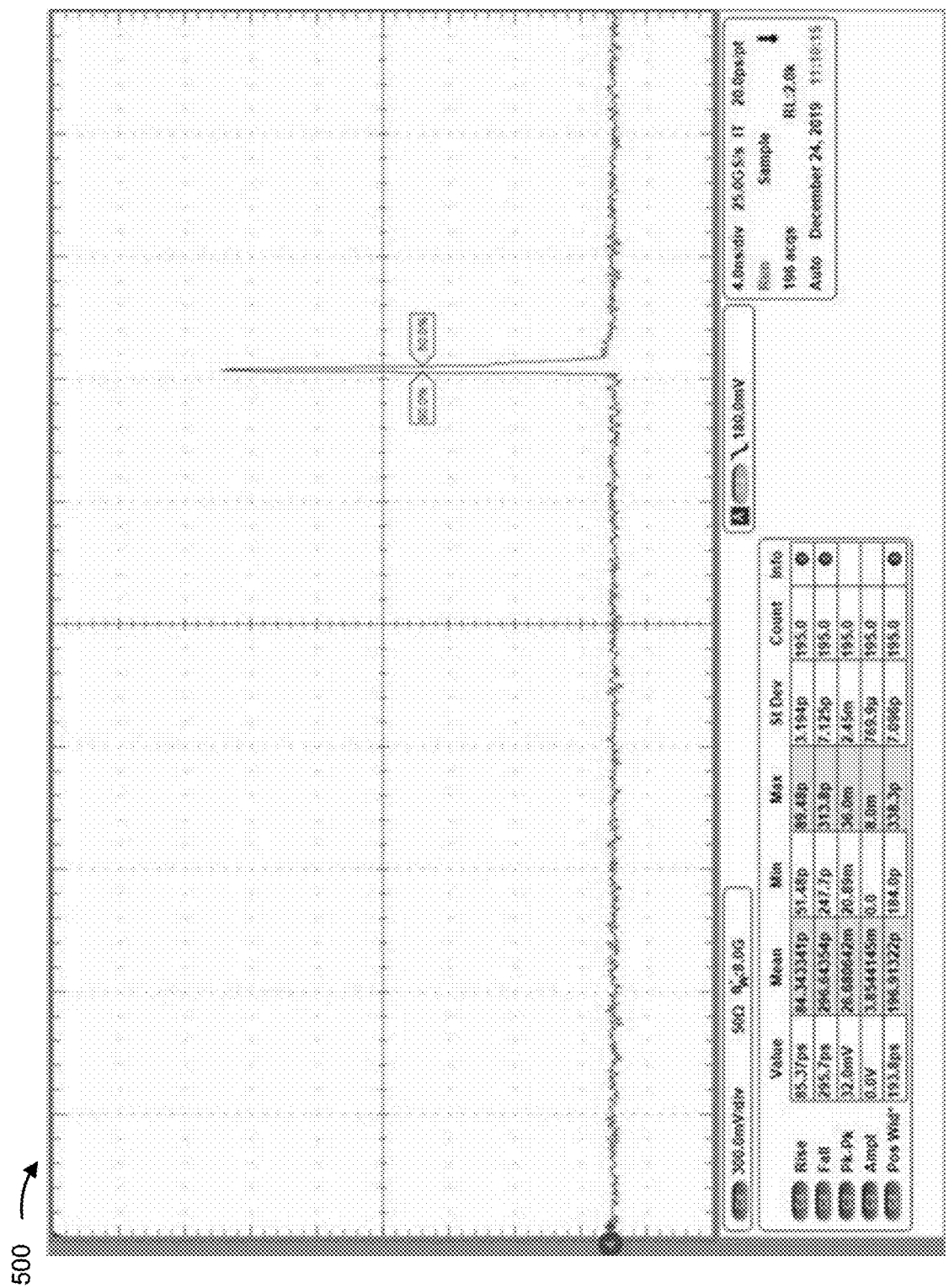
FIG. 5 is a diagram of an example graph plotting voltages from an optical detector receiving an optical signal associated with an example implementation of an electrical drive circuit and optical load described herein.

FIG. 5 is a diagram of an example graph 500 (e.g., that may be obtained from an oscilloscope) plotting voltages from an optical detector receiving an optical signal associated with an example implementation of an electrical drive circuit and optical load described herein. For example, the electrical drive circuit and optical load may be similar to the electrical drive circuits and the optical loads described herein with respect to FIGS. 1A, 2, and/or 3. The example graph 500 plots an optical signal (e.g., an optical pulse, a compensation optical pulse, and/or the like) generated by an AC-coupled compensation section of a VCSEL array in response to electrical signals provided, by the electrical drive circuit, to the AC-coupled compensation section, where the electrical signals correspond to a compensation electrical pulse similar to the compensation electrical pulses described herein with respect to FIGS. 1A, 2, 3, 4A, and/or 4B.

As shown in FIG. 5, the optical pulse (e.g., a compensation optical pulse) has a short rise time (e.g., a fast rise time). As noted herein, short rise times may facilitate achievement of a rectangular-shaped optical pulse. Additionally, and as also shown in FIG. 5, the optical pulse has a narrow width and a fall time, which, in some implementations, may be tuned to compensate for a rise time of a main optical pulse as described herein.

Figure 6:
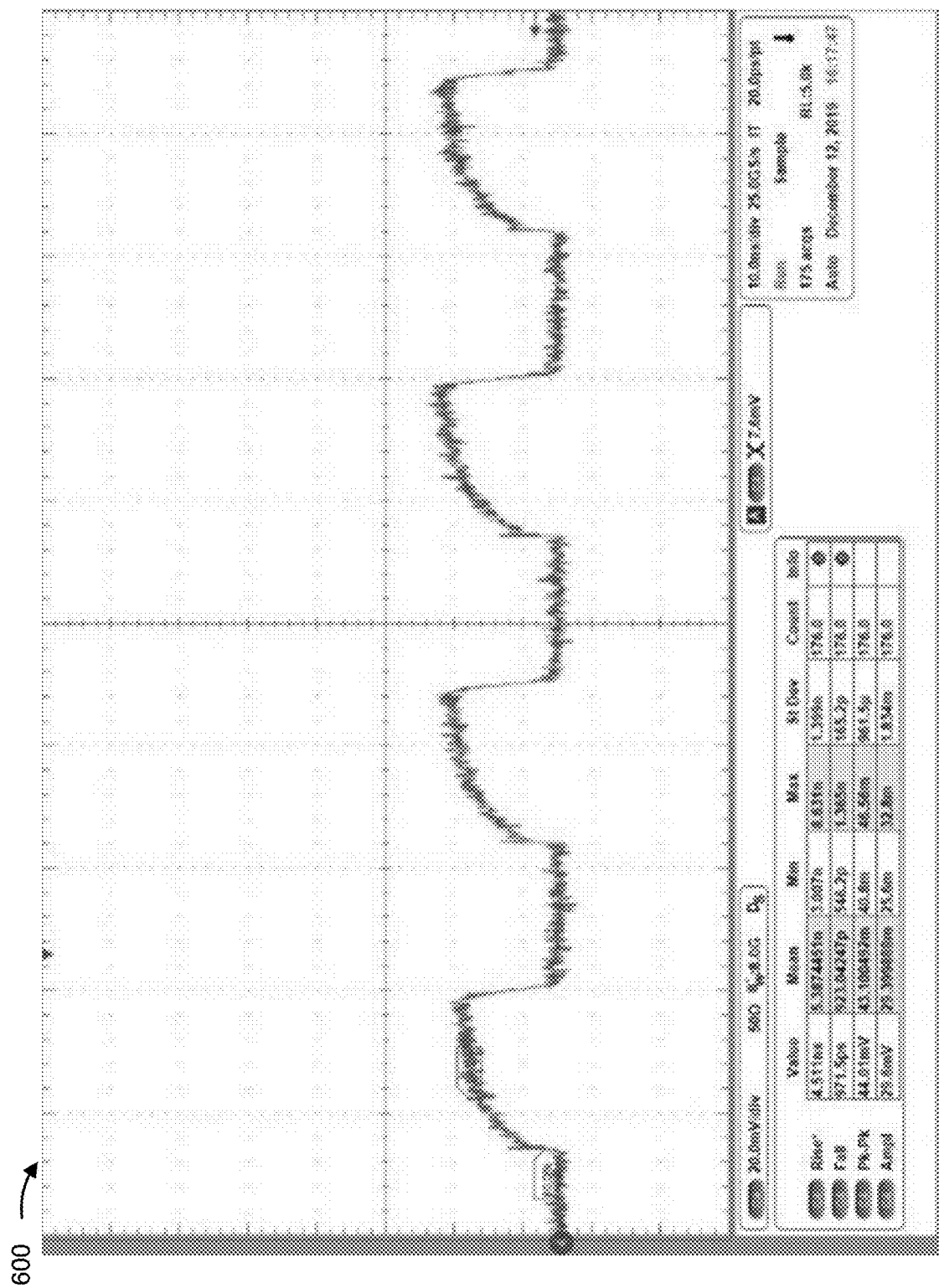
FIG. 6 is a diagram of an example graph plotting voltages from an optical detector receiving an optical signal associated with an example implementation of an electrical drive circuit and optical load described herein.

FIG. 6 is a diagram of an example graph 600 (e.g., that may be obtained from an oscilloscope) plotting voltages from an optical detector receiving an optical signal associated with an example implementation of an electrical drive circuit and optical load described herein. For example, the electrical drive circuit and optical load may be similar to the electrical drive circuits and the optical loads described herein with respect to FIGS. 1A, 1B, 2, and/or 3. The example graph 600 plots an optical signal (e.g., of a series of optical pulses, main optical pulses, and/or the like) generated by a DC-coupled main section of a VCSEL array in response to electrical signals provided, by the electrical drive circuit, to the DC-coupled main section, where the electrical signals correspond to a series of main electrical pulses similar to the main electrical pulses described herein with respect to FIGS. 1A, 1B, 2, 3, 4A, and/or 4B.

As shown in FIG. 6, the optical pulses (e.g., main optical pulses) of the optical signal have a long rise time (e.g., due to parasitic inductance), which distorts a shape of the optical pulses away from a rectangular shape. Additionally, and as also shown in FIG. 6, the optical pulses have a short fall time (e.g., a fast fall time), where power of the optical pulse is falling from peak power to zero. As noted herein, short fall times may facilitate achievement of a rectangular-shaped optical pulse.

In FIGS. 5-6, limitations on measurement equipment (e.g. bandwidth limitations on oscilloscopes, parasitic aspects of a probe, EMI (electromagnetic interference) from a high speed switching FET (field effect transistor), and/or the like) may inhibit clean and accurate measurements of sub-nanosecond or picosecond electrical pulses directly from the electrical drive circuit. Accordingly, simulations may be used to estimate peak current provided by an electrical drive circuit to an optical load.

As indicated above, FIGS. 5-6 are provided merely as examples. Other examples may differ from what is described with regard to FIGS. 5-6.

Figure 7:
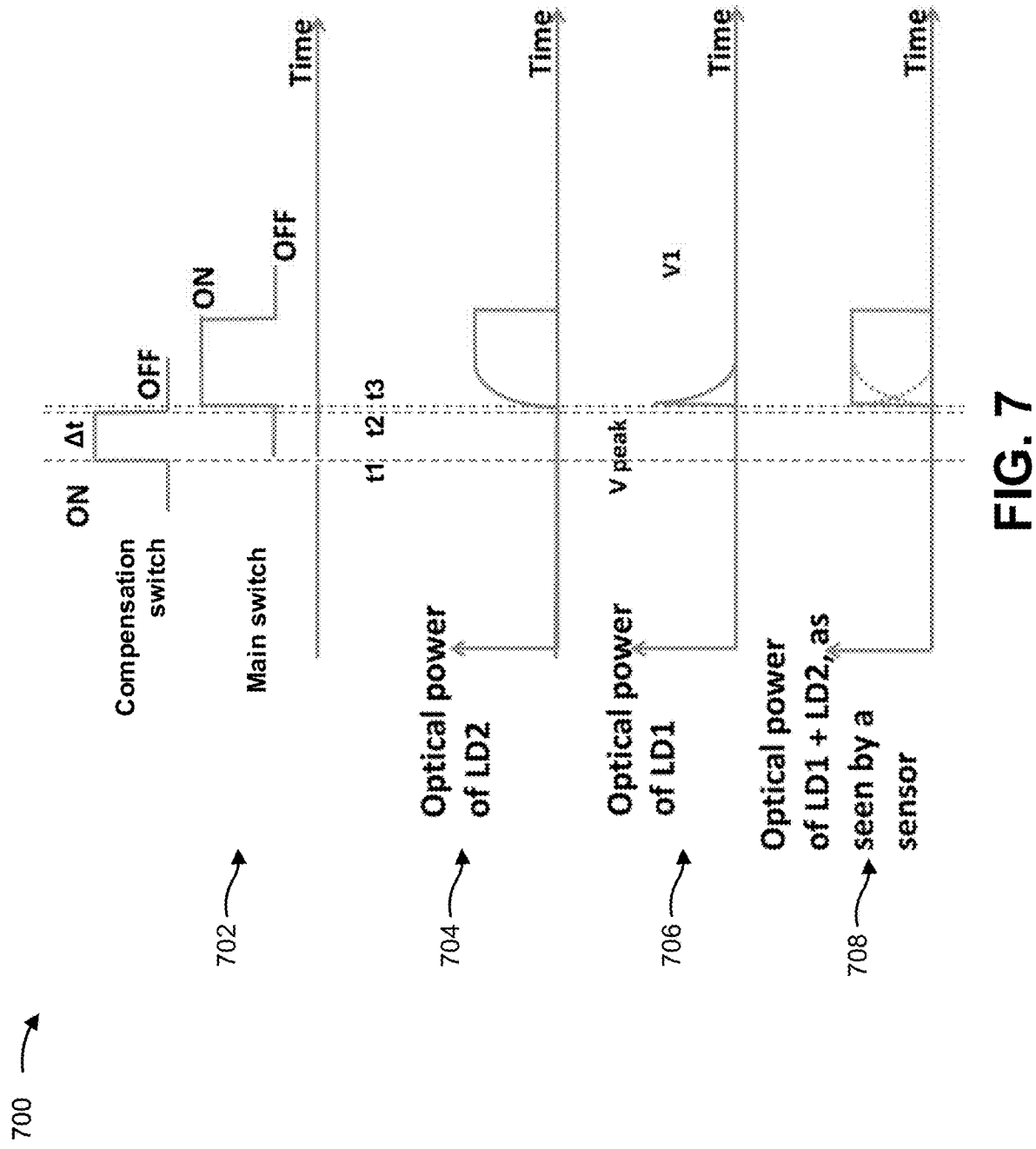
FIG. 7 is a diagram of example graphs plotting switch timing in an example implementation of an electrical drive circuit and a multi-section optical load, optical power of a section of the multi-section optical load, optical power of another section of the multi-section optical load, and optical power of the multi-section optical load as seen by a sensor.

FIG. 7 is a diagram of example graphs 702, 704, 706, and 708 plotting switch timing in an example implementation 700 of an electrical drive circuit and a multi-section optical load (example graph 702), optical power of a section of the multi-section optical load in the example implementation (example graph 704), optical power of another section of the multi-section optical load in the example implementation (example graph 706), and optical power of the multi-section optical load in the example implementation as seen by a sensor (example graph 708).

Example graph 702 plots switch timing of a main switch (e.g., the main switch 130 of FIG. 1A, the main switch 230 of FIG. 2, the main switch 330 of FIG. 3, and/or the like) and a compensation switch (e.g., the compensation switch 114 of FIG. 1A, the compensation switch 214 of FIG. 2, the compensation switch 314 of FIG. 3, and/or the like). As shown in FIG. 7, the main switch and the compensation switch may initially be off (e.g., in an open state), and, at a time t1, the compensation switch may turn on (e.g., transition from the open state to a closed state).

As further shown in FIG. 7 by example graph 702, the compensation switch may remain on (e.g., in the closed state) for a time interval Δt. In some implementations, the time interval Δt may correspond to a charging time as described herein with respect to FIGS. 1A, 2, 3, 4A, and/or 4B. For example, during the time interval Δt, an electrical drive circuit may cause current to charge one or more inductive elements (e.g., through a charging circuit path). Alternatively, in the case of the circuit(s) shown in FIG. 1B, the compensation switch 164 and the main switch 180 may have the same timing to produce a short pulse at a much lower current.

As shown in FIG. 7 by example graph 702, the compensation switch may turn off (e.g., transition from a closed state to an open state) at a time t2. In some implementations, when the compensation switch turns off, one or more inductive elements may discharge to provide a compensation electrical pulse to drive a compensation section of an optical load to emit a compensation optical pulse as described herein with respect to FIGS. 1A, 2, 3, 4A, and/or 4B.

As further shown in FIG. 7 by example graph 702, the main switch may turn on (e.g., transition from the open state to a closed state) at a time t3. In some implementations, when the main switch turns on, the electrical drive circuit may generate a main electrical pulse to drive a main section of an optical load to emit a main optical pulse as described herein with respect to FIGS. 1A, 1B, 2, 3, 4A, and/or 4B. Additionally, or alternatively, and as shown in FIG. 7 by example graph 702, the main switch may remain on (e.g., in the closed state) for a main time interval and then turn off. In some implementations, the time t2 and the time t3 may be a same time. In some implementations, the time t2 may occur after the time t3.

Example graph 704 plots optical power of a main section (e.g., LD2) of the multi-section optical load. As shown in FIG. 7 by example graph 704, the optical power of the main section may begin increasing at the time t3 when the main switch turns on, and the rise time of the optical power may be long, which distorts a shape of a main optical pulse, emitted by the main section, away from a rectangular shape. As also shown in FIG. 7 by example graph 704, the optical power of the main section may have a short fall time (e.g., a fast fall time).

Example graph 706 plots optical power of a compensation section (e.g., LD1) of the multi-section optical load. As shown in FIG. 7 by example graph 706, at time t1 when the compensation switch turns on (e.g., transitions from the open state to a closed state), the optical power of the compensation section may be zero (e.g., because the compensation switch shorts current from a source to ground). In some implementations, at time t1 when the compensation switch turns on, current may increase and pass through the compensation switch and one or more inductive elements during the time interval Δt.

As shown in FIG. 7 by example graph 706, at time t2 when the compensation switch turns off (e.g., transitions from the closed state to the open state), the optical power of the compensation section may not immediately increase. In some implementations, at time t2 when the compensation switch turns off, the optical power of the compensation section may not immediately increase because there may be a short delay (e.g., two nanoseconds or less, one nanosecond or less, 0.5 nanoseconds or less, and/or the like) between time t2 and a time when a compensation electrical pulse is generated (e.g., by discharging one or more inductive elements) to drive the compensation section to emit a compensation optical pulse).

Additionally, or alternatively, the time t2 and the time t3 may be controlled, adjusted, and/or the like (e.g., by a controller performing delay tuning as noted with respect to FIGS. 4A and 4B) to account for the short delay such that, as shown in example graph 706, the optical power of the compensation section may increase to a peak power at the time t3 when the main switch turns on (e.g., transitions from the open state to a closed state). In some implementations, the time t2 and the time t3 may be controlled, adjusted, and/or the like (e.g., by a controller performing delay tuning as noted with respect to FIGS. 4A and 4B) based on a pulse width of the compensation electrical pulse and/or the compensation optical pulse, control signal propagation delays (e.g., from the controller to the gate drivers and/or the like), and/or the like. However, as noted above, the time t2 and the time t3 may be a same time, in some implementations.

As further shown in FIG. 7 by example graph 706, the optical power of the compensation section may have a short rise time, and, after reaching peak power, may slowly decrease to zero and, therefore, have a long fall time. For example, one or more inductive elements discharging current to provide the compensation electrical pulse to the compensation section may increase the optical power of the compensation section and, as the current discharged by the one or more inductive elements decreases, the optical power of the compensation section may decrease to zero.

Example graph 708 plots optical power of the multi-section optical load, including the main section and the compensation section, as seen by a sensor. As shown in FIG. 7 by example graph 708, the optical power of the multi-section optical load as seen by the sensor may at time t3 increase quickly to peak power and, therefore, have a short rise time. As also shown in FIG. 7 by example graph 708, the optical power of the multi-section optical load as seen by the sensor may quickly decrease from peak power to zero and, therefore, have a short fall time. As further shown in FIG. 7 by example graph 708, the optical power of the multi-section optical load as seen by the sensor may have a constant amplitude (e.g., low rippling) between the rise time and the fall time. In this regard, the optical power of the multi-section optical load as seen by the sensor has a rectangular shape, which may improve performance of a time-of-flight-based measurement system.

As also shown in FIG. 7 by the dashed lines in example graph 708, the optical power of the multi-section optical load as seen by the sensor may correspond to a sum of the optical power of the main section (e.g., as shown in example graph 704) and the optical power of the compensation section (e.g., as shown in example graph 706). In some implementations, the optical power of the compensation section, when emitting a compensation optical pulse, may compensate for the optical power of the main section, when emitting a main optical pulse, such that the optical power of the multi-section optical load as seen by the sensor (e.g., a combined optical pulse emitted by the multi-section optical load) has a rectangular shape. For example, and as shown in FIG. 7 by example graphs 704, 706, and 708, the short rise time of the compensation optical pulse may compensate for the long rise time of the main optical pulse. Additionally, or alternatively, and as shown in FIG. 7 by example graphs 704, 706, and 708, the fall time of the compensation optical pulse may correspond to the rise time of the main optical pulse (e.g., such that the compensation optical pulse compensates for the main optical pulse during the long rise time of the main optical pulse).

In some implementations, a controller may control an electrical drive circuit (e.g., including a charging circuit path, a discharging circuit path, and a main circuit path) based on the switch timing of example graph 702 of FIG. 7. For example, the controller may control, based on the switch timing of example graph 702 of FIG. 7, the electrical drive circuit to provide the compensation electrical pulse to the compensation section and provide the main electrical pulse to the main section to generate a single combined optical pulse. Additionally, or alternatively, the controller may control the electrical drive circuit, based on the switch timing of example graph 702, to repeatedly, at a pulse frequency, provide the compensation electrical pulse to the compensation section and provide the main electrical pulse to the main section. For example, the pulse frequency may be in a range from 20 megahertz (MHz) to 200 MHz. In some implementations, specifications of switches, one or more controllers, one or more FETs, one or more gate drivers, and/or the like may limit the range of the pulse frequency (e.g., rather than other components and/or elements of the electrical drive circuit).

As indicated above, FIG. 7 is provided merely as an example. Other examples may differ from what is described with regard to FIG. 7.

Figure 8A:
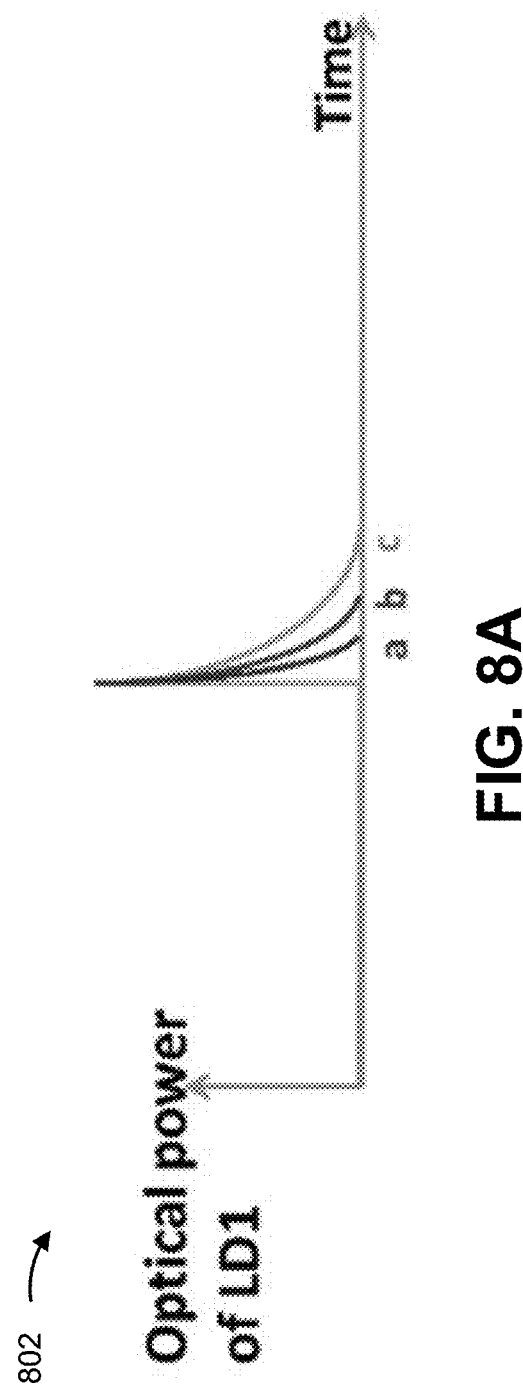
FIGS. 8A and 8B are diagrams of example graphs plotting shapes of optical power of a section of a multi-section optical load in example implementations described herein.
Figure 8B:
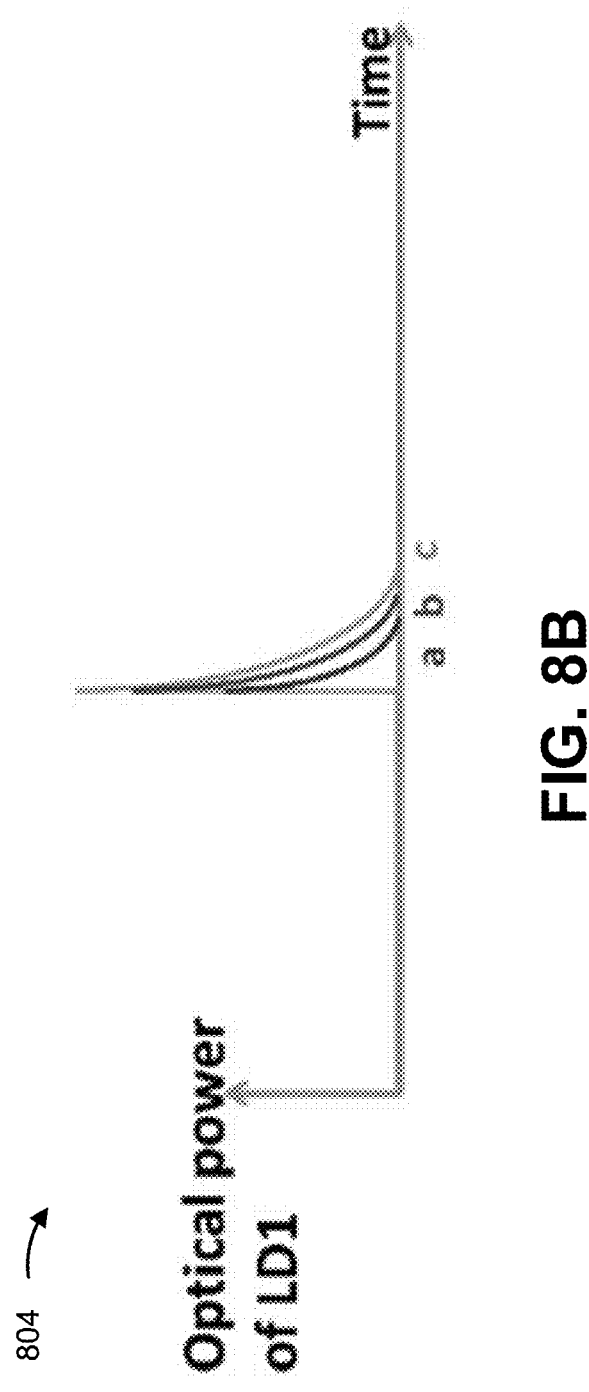

FIGS. 8A and 8B are diagrams of example graphs 802 and 804 plotting shapes of optical power of a section (e.g., LD1) of a multi-section optical load in example implementations described herein. For example, the example graphs 802 and 804 may plot shapes of optical power of a compensation section driven by an electrical drive circuit as described herein with respect to FIGS. 1A, 1B, 2, and/or 3.

As shown in FIG. 8A by example graph 802, a compensation width (e.g., a width of a compensation optical pulse) may be adjusted to achieve compensation widths a, b, and c. For example, a capacitance of a compensation capacitive element (e.g., the compensation capacitive element 110 of FIG. 1A, the compensation capacitive element 160 of FIG. 1B, and/or the like), in the electrical drive circuit, may be adjusted to achieve different compensation widths. In some implementations, a higher capacitance may increase the compensation width, such as for compensation width c. Additionally, or alternatively, a lower capacitance may decrease the compensation width, such as for compensation width a. In some implementations, by adjusting the capacitance of the compensation capacitive element, the electrical drive circuit may generate a compensation electrical pulse to drive the compensation section to emit a compensation optical pulse having different compensation widths.

As shown in FIG. 8B and by example graph 804, a compensation strength (e.g., a maximum optical power and/or a fall time of a compensation optical pulse) may be adjusted to achieve compensation strengths a, b, and c. For example, a voltage supplied by a source (e.g., the compensation source 108 of FIG. 1A, the compensation source 158 of FIG. 1B, and/or the like) and/or an inductance of an inductive element (e.g., the compensation inductive element 112 of FIG. 1A, the compensation inductive element 212 of FIG. 2, and/or the like), in the electrical drive circuit, may be adjusted to achieve different compensation strengths. In some implementations, a higher voltage and/or a higher inductance may increase the compensation strength, such as for compensation strength c. Additionally, or alternatively, a lower voltage and/or a lower inductance may decrease the compensation strength, such as for compensation strength a. In some implementations, by adjusting the voltage supplied by the source and/or the inductance of the inductive element, the electrical drive circuit may generate a compensation electrical pulse to drive the compensation section to emit a compensation optical pulse having different compensation strengths.

By adjusting compensation width and adjusting compensation strength, the electrical drive circuit may achieve a compensation optical pulse that compensates (e.g., complements) a main optical pulse to achieve a combined optical pulse having a rectangular shape. In this way, the electrical drive circuit may be designed to provide a compensation electrical pulse to drive a compensation section to emit a compensation optical pulse and to provide a main electrical pulse to drive a main section to emit a main optical pulse, such that a combined optical pulse (e.g., emitted by a multi-section optical load including the compensation section and the main section) has a rectangular shape. Furthermore, by driving the multi-section optical load to emit a rectangular-shaped optical pulse, the electrical drive circuit may improve performance of a time-of-flight-based measurement system.

As indicated above, FIGS. 8A and 8B are provided merely as examples. Other examples may differ from what is described with regard to FIGS. 8A and 8B.

FIGS. 9A and 9B are diagrams of example graphs 902 and 904 (e.g., that may be obtained from an oscilloscope) plotting voltages from an optical detector receiving optical signals associated with example implementations of electrical drive circuits and optical loads described herein. For example, the example graphs 902 and 904 may plot shapes of optical signals associated with a compensation section driven by an electrical drive circuit as described herein with respect to FIGS. 1A, 1B, 2, and/or 3.

As shown in FIG. 9A and 9B, a compensation width (e.g., a width of a compensation optical pulse) may be adjusted to achieve different compensation widths. For example, a capacitance of a compensation capacitive element (e.g., the compensation capacitive element 110 of FIG. 1A, the compensation capacitive element 160 of FIG. 1B, and/or the like), in the electrical drive circuit, may be adjusted to achieve different compensation widths. In some implementations, an electrical drive circuit driving a compensation section to emit the compensation optical pulse shown in FIG. 9A may include a compensation capacitive element having a capacitance that is lower than a capacitance of another compensation capacitive element included in another electrical drive circuit driving a compensation section to emit the compensation optical pulse shown in FIG. 9B. In other words, for a compensation capacitive element in an electrical drive circuit, a lower capacitance may result in a narrower compensation width as shown in FIG. 9A, and a higher capacitance may result in a wider compensation width as shown in FIG. 9B.

As indicated above, FIGS. 9A and 9B are provided merely as examples. Other examples may differ from what is described with regard to FIGS. 9A and 9B.

FIGS. 10A, 10B, 10C, and 10D are diagrams of example implementations 1002, 1004, 1006, 1008 of a multi-section optical load described herein. For example, the multi-section optical loads of example implementations 1002, 1004, 1006, 1008 may be similar to the multi-section optical load 140 of FIG. 1A, the multi-section optical load 190 of FIG. 1B, the multi-section optical load 240 of FIG. 2, the multi-section optical load 340 of FIG. 3, and/or the like.

As shown in FIG. 10A, the multi-section optical load may be a single VCSEL array die (e.g., a die including an array of VCSELs) including two sections, section 1 and section 2, where each section includes a set of VCSELs of the array. In some implementations, section 1 and section 2 may be a compensation section and a main section, respectively, as described herein with respect to FIGS. 1A, 1B, 2, and/or 3. In some implementations, section 1 and section 2 may include a same quantity of VCSELs or different quantities of VCSELs (e.g., as shown in FIG. 10A). Additionally, or alternatively, and as shown in FIG. 10A, section 1 and section 2 may be adjacent to each other on the VCSEL array die.

As shown in FIG. 10B, the multi-section optical load may be a single VCSEL array die (e.g., a die including an array of VCSELs) including two sections, section 1 and section 2, where the sections are interleaved on the single VCSEL array die. In some implementations, section 1 and section 2 may be a compensation section and a main section, respectively, as described herein with respect to FIGS. 1A, 1B, 2, and/or 3. In some implementations, section 1 and section 2 may include a first set of VCSELs and a second set of VCSELs, respectively, wherein the first set of VCSELs are interspersed within the second set of VCSELs. For example, and as shown in FIG. 10B, the first set of VCSELs of section 1 and the second set of VCSELs of section 2 may be alternating rows of VCSELs on the VCSEL array die.

As shown in FIG. 10C, the multi-section optical load may be a package of VCSEL array dies including two VCSEL array dies, die 1 and die 2. In some implementations, die 1 and die 2 may be a compensation section and a main section, respectively, as described herein with respect to FIGS. 1A, 1B, 2, and/or 3.

As shown in FIG. 10D, the multi-section optical load may include different sections with VCSELs arranged in an interspersed manner. For example, as shown in FIG. 10D, the VCSELs may be arranged in an array, and each VCSEL may included in one of multiple groups of VCSELs. For example, the VCSELs shown by black circles may be a first group of VCSELs, the VCSELs shown by white circles may be a second group of VCSELs, and the VCSELs shown by striped circles may be a third group of VCSELs. The various groups of VCSELs may be interspersed, for example, to enable different groups of VCSELS to be independently addressed (e.g., during lasing operation). In some implementations, further detail relating to the interspersed VCSEL array shown in FIG. 10D is provided in U.S. Patent Application Publication No. 2002/00119527, the contents of which are hereby incorporated by reference.

As indicated above, FIGS. 10A, 10B, 10C, and 10D are provided merely as examples. Other examples may differ from what is described with regard to FIGS. 10A, 10B, 10C, and 10D. For example, the multi-section optical load may include more than two sections and/or dies (e.g., three, four, five, six, and/or the like). Additionally, or alternatively, VCSELs of a section may be arranged in any manner with respect to VCSELs of another section. In some implementations, VCSELs of a section may be positioned in a pattern (e.g., a regular pattern, a pseudo-random pattern, and/or the like), a shape (e.g., a rectangle, a square, a circle, and/or the like), and/or the like on a VCSEL array die, within a package, with respect to VCSELs of another section, and/or the like. In some implementations, the VCSELs of all sections of the multi-section optical load may be configured to emit light at a same wavelength while the VCSELs from one section of the multi-section optical load may have different structural features (e.g., a number of junctions, an optical aperture size or shape, an oxidation trench size or shape, a pitch between emitters, an array layout, an operating current, and/or the like) as compared with VCSELS from another section of the multi-section optical load.

Figure 11:
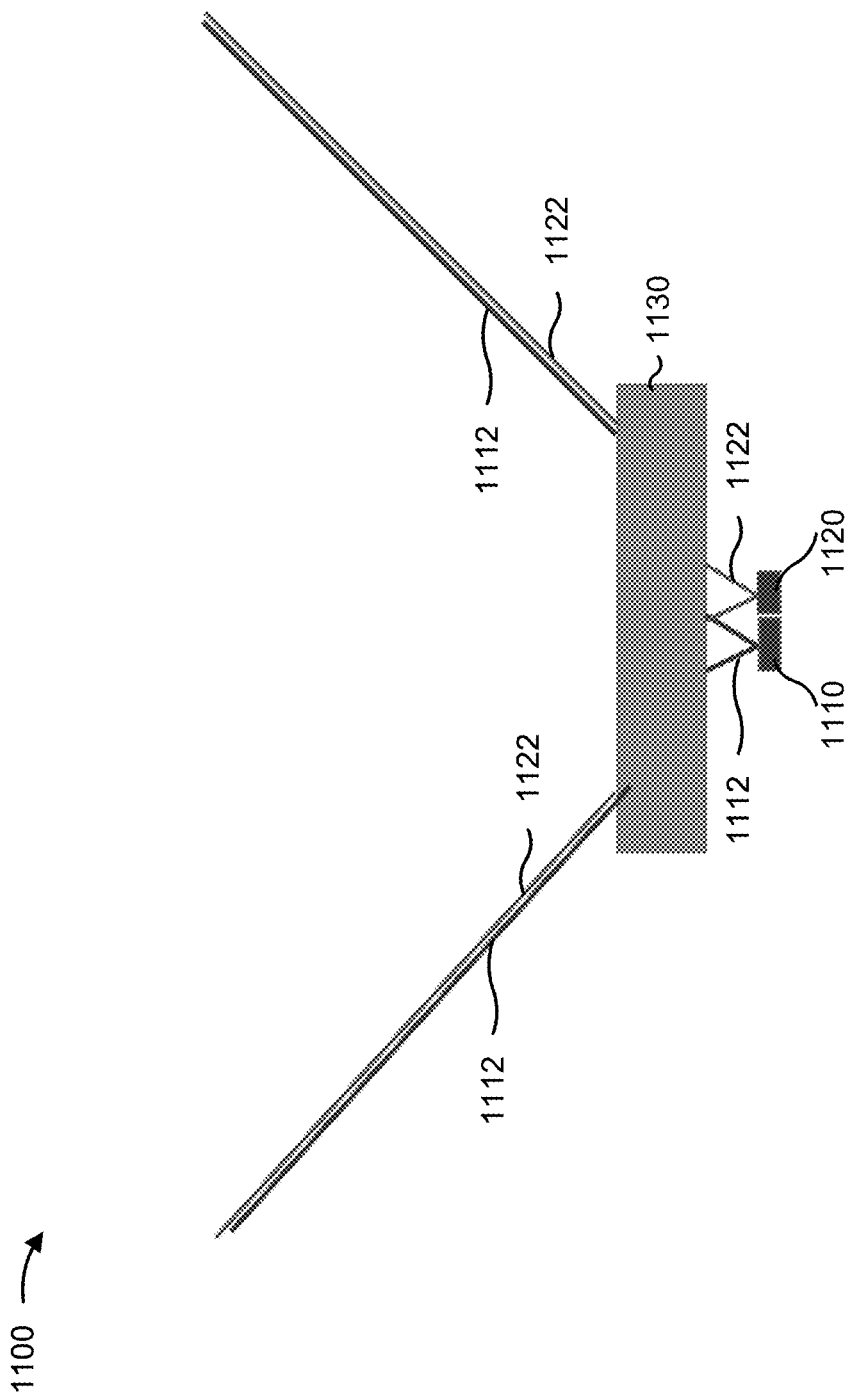
FIG. 11 is a diagram of an example optical output field of view of an example implementation of an electrical drive circuit and multi-section optical load as described herein.

FIG. 11 is a diagram of an example optical output field of view of an example implementation 1100 of an electrical drive circuit and multi-section optical load as described herein. As shown in FIG. 11, an optical device may include a multi-section optical load including a compensation section 1110 and a main section 1120. For example, the multi-section optical load, the compensation section 1110, and the main section 1120 may be similar to the multi-section optical load, the compensation section, and the main section, respectively, as shown in and described herein with respect to FIGS. 1A, 1B, 2, and/or 3. Additionally, or alternatively, the multi-section optical load, the compensation section 1110, and the main section 1120 may be driven by an electrical drive circuit similar to the electrical drive circuits shown in and described herein with respect to FIGS. 1A, 1B, 2, and/or 3.

As shown in FIG. 11, the electrical drive circuit may drive the compensation section 1110 to emit a compensation optical pulse having an optical output field of view 1112, and may drive the main section 1120 to emit a main optical pulse having an optical output field of view 1122. In some implementations, and as shown in FIG. 11, the optical device may include an optical element 1130, such as a diffuser, and the optical element 1130 may mix light of the compensation optical pulse with light of the main optical pulse such that the compensation section 1110 and the main section 1120 have a same illumination region. For example, the compensation section 1110 and the main section 1120 may be relatively small as compared to the optical element 1130 such that, when the compensation section 1110 and the main section 1120 are positioned near each other, the optical element 1130 (e.g., a single optical element) may be positioned in the output field of view 1112 and the output field of view 1122 to mix light of the compensation optical pulse with light of the main optical pulse.

In FIG. 11, the output field of view 1112 and the output field of view 1122 above the optical element 1130 may appear to be offset from each other. However, the offset is merely for illustrative purposes, and the output field of view 1112 and the output field of view 1122 above the optical element 1130 may be substantially the same.

As indicated above, FIG. 11 is provided merely as an example. Other examples may differ from what is described with regard to FIG. 11. For example, in some implementations, the VCSELs of all sections of the multi-section optical load may be configured to emit light in the same field of view.

Figure 12:
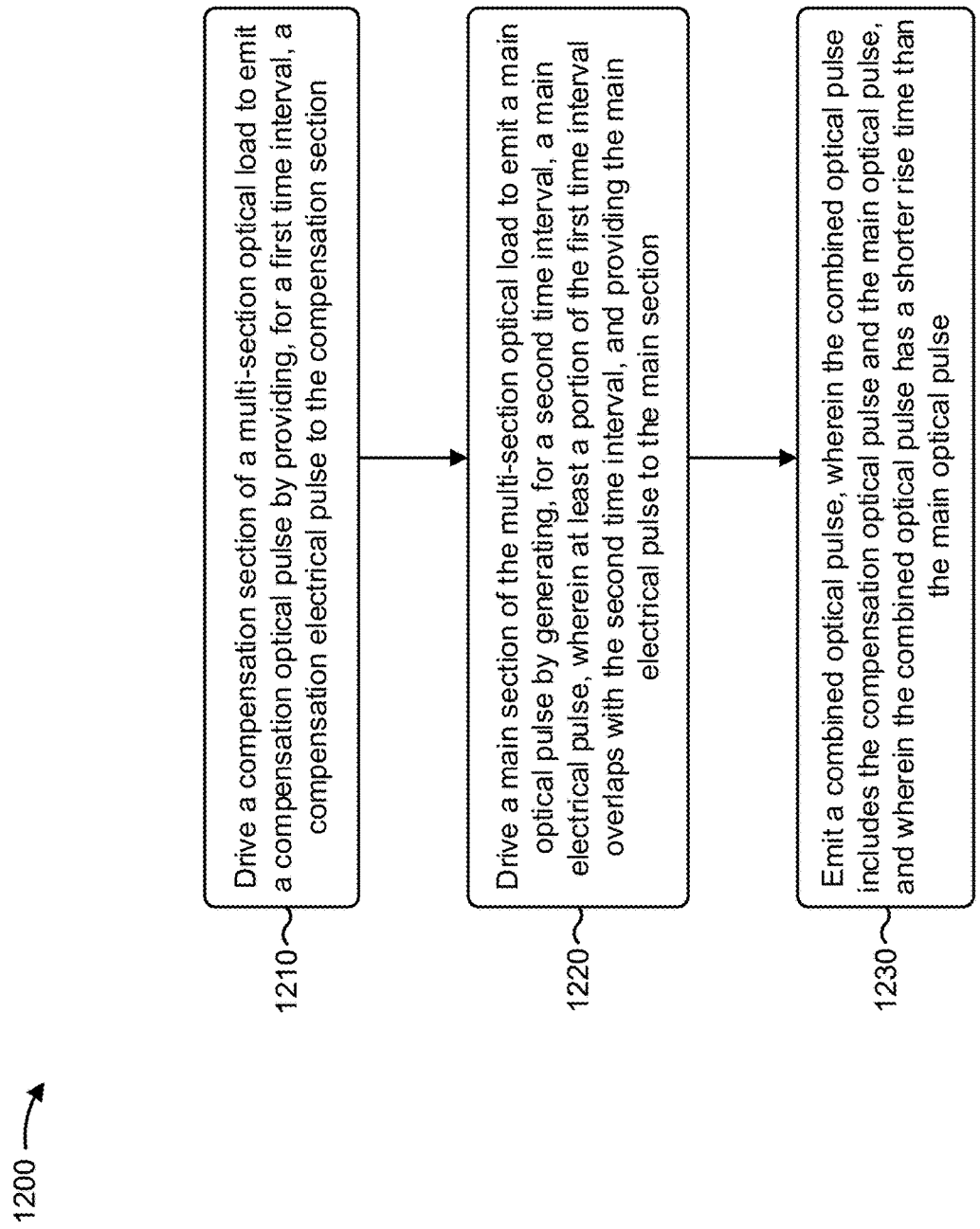
FIG. 12 is a flowchart of an example process for driving a multi-section optical load.

FIG. 12 is a flow chart of an example process 1200 for driving a multi-section optical load. In some implementations, one or more process blocks of FIG. 12 may be performed by an optical device (e.g., an optical device as shown in and described with respect to FIGS. 1A, 1B, 2, 3, 4A, 4B, 7, 8A, 8B, 10A, 10B, 10C, and/or 11). In some implementations, one or more process blocks of FIG. 12 may be performed by another device or a group of devices separate from or including the optical device, such as an electrical drive circuit (e.g., an electrical drive circuit as shown in and described with respect to FIGS. 1A, 1B, 2, 3, 4A, 4B, 7, 8A, 8B, 10A, 10B, 10C, and/or 11), a time-of-flight-based measurement system (e.g., a direct time-of-flight-based measurement system, an indirect time-of-flight-based measurement system, and/or the like), a 3D sensing system, a LIDAR system, and/or the like. Additionally, or alternatively, one or more process blocks of FIG. 12 may be performed by one or more components of an electrical drive circuit, an optical device, a time-of-flight-based measurement system, a 3D sensing system, a LIDAR system, and/or the like, such as a main circuit path, a charging circuit path, a discharging circuit path, one or more sources, one or more switches, a controller, and/or the like.

As shown in FIG. 12, process 1200 may include driving a compensation section of a multi-section optical load to emit a compensation optical pulse by providing, for a first time interval, a compensation electrical pulse to the compensation section (block 1210). For example, the electrical drive circuit and/or the optical device including the electrical drive circuit and the multi-section optical load may drive a compensation section of the multi-section optical load to emit a compensation optical pulse by, providing, for a first time interval, a compensation electrical pulse to the compensation section, as described above.

As further shown in FIG. 12, process 1200 may include driving a main section of the multi-section optical load to emit a main optical pulse by generating, for a second time interval, a main electrical pulse, wherein at least a portion of the first time interval overlaps with the second time interval, and providing the main electrical pulse to the main section (block 1220). For example, the electrical drive circuit and/or the optical device including the electrical drive circuit and the multi-section optical load may drive a main section of the multi-section optical load to emit a main optical pulse by generating, for a second time interval, a main electrical pulse and providing the main electrical pulse to the main section, as described above. In some implementations, at least a portion of the first time interval overlaps with the second time interval.

As further shown in FIG. 12, process 1200 may include emitting a combined optical pulse, wherein the combined optical pulse includes the compensation optical pulse and the main optical pulse, and wherein the combined optical pulse has a shorter rise time than the main optical pulse (block 1230). For example, the electrical drive circuit and/or the optical device including the electrical drive circuit and the multi-section optical load may emit a combined optical pulse, as described above. In some implementations, the combined optical pulse includes the compensation optical pulse and the main optical pulse. In some implementations, the combined optical pulse has a shorter rise time than the main optical pulse.

Process 1200 may include additional implementations, such as any single implementation or any combination of implementations described below and/or in connection with one or more other processes described elsewhere herein.

In a first implementation, the main optical pulse has a longer rise time as compared to the compensation optical pulse, and a shorter rise time of the compensation optical pulse compensates for the longer rise time of the main optical pulse.

In a second implementation, alone or in combination with the first implementation, the first time interval begins at a same time as the second time interval.

In a third implementation, alone or in combination with one or more of the first and second implementations, the first time interval begins before the second time interval.

In a fourth implementation, alone or in combination with one or more of the first through third implementations, the first time interval is less than half the second time interval.

In a fifth implementation, alone or in combination with one or more of the first through fourth implementations, driving the compensation section of the multi-section optical load to emit the compensation optical pulse may include charging one or more inductive elements, and discharging, after the charging and for the first time interval, the one or more inductive elements to provide the compensation electrical pulse to the compensation section, and driving the main section of the multi-section optical load may include generating the main electrical pulse after the charging.

In a fifth implementation, alone or in combination with one or more of the first through fourth implementations, the electrical drive circuit and/or the optical device includes a charging circuit path for charging the one or more inductive elements, and a discharging circuit path for discharging the compensation electrical pulse.

In a sixth implementation, alone or in combination with one or more of the first through fifth implementations, charging the one or more inductive elements comprises closing a switch in the electrical drive circuit for a charging time, and discharging the one or more inductive elements to provide the compensation electrical pulse comprises opening, after the charging time, the switch.

In a seventh implementation, alone or in combination with one or more of the first through sixth implementations, the multi-section optical load is a vertical-cavity surface-emitting laser (VCSEL) array die, and each of the compensation section and the main section is a section of the VCSEL array die.

In an eighth implementation, alone or in combination with one or more of the first through seventh implementations, the multi-section optical load is a package of VCSEL array dies, and each of the compensation section and the main section is a VCSEL array die of the package.

Although FIG. 12 shows example blocks of process 1200, in some implementations, process 1200 may include additional blocks, fewer blocks, different blocks, or differently arranged blocks than those depicted in FIG. 12. Additionally, or alternatively, two or more of the blocks of process 1200 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, the terms circuit, integrated circuit, chip, chipset, die, semiconductor device, electronic device, and/or the like are intended to be broadly construed as applicable to the various implementations described herein, as these terms can be used interchangeably in the field of electronics. With respect to a circuit, an integrated circuit, and/or the like, power, ground, and various signals may be coupled between and among circuit elements (e.g., resistors, inductors, capacitors, transistors, and/or the like) via physical, electrically conductive connections. Such a point of connection may be referred to as an input, output, input/output (I/O), terminal, line, pin, pad, port, interface, or similar variants and combinations. Although connections between and among circuits can be made by way of electrical conductors, circuits and other circuit elements may additionally, or alternatively, be coupled by way of optical, mechanical, magnetic, electrostatic, electromagnetic, and/or other suitable interfaces.

It will be apparent that systems and/or methods described herein may be implemented in different forms of hardware, software, circuitry, or a combination thereof. The actual specialized control hardware, software code, or circuitry used to implement these systems and/or methods is not limiting of the implementations. Thus, the operation and behavior of the systems and/or methods are described herein without reference to specific software code—it being understood that software and hardware (e.g., integrated circuits) can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An electrical drive circuit for driving a multi-section optical load, the electrical drive circuit comprising:
   a charging circuit path for charging, during a charging time between a first time and a second time, one or more inductive elements;
   a discharging circuit path for generating, during a first time interval after the charging time, a compensation electrical pulse by discharging the one or more inductive elements; and
   a main circuit path for generating, during a second time interval beginning at a third time different from the second time, a main electrical pulse,
      wherein at least a portion of the first time interval overlaps with the second time interval;
   wherein the electrical drive circuit is configured to:
      provide the compensation electrical pulse to a compensation section of the multi-section optical load to cause the compensation section to emit a compensation optical pulse,
         wherein the second time and the third time are controlled or adjusted such that an optical power of the compensation section increases to a peak power at the third time; and
      provide the main electrical pulse to a main section of the multi-section optical load to cause the main section to emit a main optical pulse,
         wherein the compensation electrical pulse and the main electrical pulse are both formed and provided to the multi-section optical load via independent circuit paths, and
         wherein a combined optical pulse includes the compensation optical pulse and the main optical pulse such that:
            a rise time of the compensation optical pulse defines a rise time of the combined optical pulse that is less than a rise time of the main optical pulse, and
            a fall time of the main optical pulse defines a fall time of the combined optical pulse.

2. The electrical drive circuit of claim 1, wherein the charging circuit path comprises:
   the one or more inductive elements;
   a capacitive element to connect in parallel to a source; and
   a switch having an open state and a closed state,
      wherein the switch being in the closed state, during the charging time, causes current to charge the one or more inductive elements and the capacitive element through the charging circuit path.

3. The electrical drive circuit of claim 2, wherein the discharging circuit path comprises:
   the one or more inductive elements; and
   the capacitive element; and
   wherein the switch transitioning from the closed state to the open state causes the one or more inductive elements to discharge current, during the first time interval, through the discharging circuit path to generate the compensation electrical pulse.

4. The electrical drive circuit of claim 1, wherein the one or more inductive elements comprise a trace having a length and a width that achieves, for the discharging circuit path, a total inductance such that the compensation optical pulse has a width and/or an amplitude that compensates the main optical pulse.

5. An optical device, comprising:
   one or more sources;
   a multi-section optical load to emit light,
      wherein the multi-section optical load includes a compensation section and a main section, and
      wherein the compensation section is electrically separated from the main section within the multi-section optical load;
   a compensation circuit for generating a compensation electrical pulse and providing the compensation electrical pulse to the compensation section;
   a main circuit for generating a main electrical pulse and providing the main electrical pulse to the main section,
      wherein the compensation circuit and the main circuit are electrically independent; and
   a controller that controls the compensation circuit and the main circuit by:
      causing the compensation circuit to generate the compensation electrical pulse for a first time interval after a charging time that is between a first time and a second time, and
      causing the main circuit to generate the main electrical pulse for a second time interval beginning at a third time different from the second time,
         wherein at least a portion of the first time interval overlaps with the second time interval;
   wherein the compensation section is to emit, in response to the compensation electrical pulse, a compensation optical pulse;
   wherein the second time and the third time are controlled or adjusted such that an optical power of the compensation section increases to a peak power at the third time;

wherein the main section is to emit, in response to the main electrical pulse, a main optical pulse, and wherein a combined optical pulse includes the compensation optical pulse and the main optical pulse such that:

a rise time of the compensation optical pulse defines a rise time of the combined optical pulse that is less than a rise time of the main optical pulse, and a fall time of the main optical pulse defines a fall time of the combined optical pulse.

6. The optical device of claim 5, wherein the multi-section optical load is a vertical-cavity surface-emitting laser (VCSEL) array die, and each of the compensation section and the main section is a section of the VCSEL array die.

7. The optical device of claim 5, wherein the multi-section optical load is a package of vertical-cavity surface-emitting laser (VCSEL) array dies, and each of the compensation section and the main section is a VCSEL array die of the package.

8. The optical device of claim 5, wherein the compensation section and the main section are interleaved.

9. The optical device of claim 5, wherein the rise time of the compensation optical pulse is less than 100 picoseconds.

10. The optical device of claim 5, wherein the rise time of the main optical pulse is longer than the rise time of the compensation optical pulse, and wherein the compensation optical pulse compensates for the rise time of the main optical pulse.

11. The optical device of claim 5, wherein the fall time of the combined optical pulse is shorter than a fall time of the compensation optical pulse.

12. The optical device of claim 5, wherein the controller is to control the compensation circuit and the main circuit to repeatedly, at a pulse frequency, provide the compensation electrical pulse to the compensation section and provide the main electrical pulse to the main section.

13. The optical device of claim 12, wherein the pulse frequency is in a range from 20 megahertz to 200 megahertz.

14. The optical device of claim 5, wherein the compensation circuit includes a charging circuit path and a discharging circuit path, and wherein the charging circuit path includes a compensation inductive element.

15. A method for driving a multi-section optical load, the method comprising:

charging, via a charging circuit path and during a charging time between a first time and a second time, one or more inductive elements;

generating, via a discharging circuit path and during a first time interval after the charging time, a compensation electrical pulse by discharging the one or more inductive elements;

generating, via a main circuit path and during a second time interval beginning at a third time different from the second time, a main electrical pulse, wherein at least a portion of the first time interval overlaps with the second time interval;

providing, via an electrical drive circuit, the compensation electrical pulse to a compensation section of the multi-section optical load to cause the compensation section to emit a compensation optical pulse, wherein the second time and the third time are controlled or adjusted such that an optical power of the compensation section increases to a peak power at the third time; and providing, via the electrical drive circuit, the main electrical pulse to a main section of the multi-section optical load to cause the main section to emit a main optical pulse, wherein the compensation electrical pulse and the main electrical pulse are both formed and provided to the multi-section optical load via independent circuit paths, and wherein a combined optical pulse includes the compensation optical pulse and the main optical pulse such that:

a rise time of the compensation optical pulse defines a rise time of the combined optical pulse that is less than a rise time of the main optical pulse, and a fall time of the main optical pulse defines a fall time of the combined optical pulse.

16. The method of claim 15, wherein the rise time of the main optical pulse is longer than the rise time of the compensation optical pulse, and wherein the rise time of the compensation optical pulse compensates for the rise time of the main optical pulse.

17. The method of claim 15, wherein the first time interval begins at a same time as the second time interval.

18. The method of claim 15, wherein the first time interval begins before the second time interval.

19. The method of claim 15, wherein the first time interval is less than half the second time interval.

20. The method of claim 15, wherein charging the one or more inductive elements comprises closing a switch in the electrical drive circuit during the charging time, and discharging the one or more inductive elements to generate the compensation electrical pulse comprises opening the switch after the charging time.

21. The method of claim 15, wherein the multi-section optical load is a vertical-cavity surface-emitting laser (VCSEL) array die, and each of the compensation section and the main section is a section of the VCSEL array die.

22. The method of claim 15, wherein the multi-section optical load is a package of vertical-cavity surface-emitting laser (VCSEL) array dies, and each of the compensation section and the main section is a VCSEL array die of the package.

23. The method of claim 15, wherein:

the compensation electrical pulse is provided to the compensation section at a pulse frequency, and the main electrical pulse is provided to the main section at the pulse frequency.

24. The method of claim 23, wherein the pulse frequency is in a range from 20 megahertz to 200 megahertz.

25. The method of claim 15, wherein the rise time of the compensation optical pulse is less than 100 picoseconds.

* * * * *